United States Patent
Li et al.

(10) Patent No.: US 12,002,421 B2
(45) Date of Patent: Jun. 4, 2024

(54) LINE DRIVE SIGNAL ENHANCEMENT CIRCUIT, SHIFT REGISTER UNIT, DISPLAY PANEL

(71) Applicant: BOE TECHNOLOGY GROUP CO., LTD., Beijing (CN)

(72) Inventors: Yunlong Li, Beijing (CN); Longfei Fan, Beijing (CN); Qian Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/771,096

(22) PCT Filed: May 31, 2021

(86) PCT No.: PCT/CN2021/097468
§ 371 (c)(1),
(2) Date: Dec. 8, 2022

(87) PCT Pub. No.: WO2022/252073
PCT Pub. Date: Dec. 8, 2022

(65) Prior Publication Data
US 2024/0153450 A1      May 9, 2024

(51) Int. Cl.
*G09G 5/00*        (2006.01)
*G09G 3/3225*      (2016.01)
*G11C 19/28*       (2006.01)
*H01L 27/12*       (2006.01)

(52) U.S. Cl.
CPC ........... *G09G 3/3225* (2013.01); *G11C 19/28* (2013.01); *H01L 27/124* (2013.01); *G09G 2310/0286* (2013.01); *G09G 2320/0223* (2013.01); *G09G 2320/0233* (2013.01); *G09G 2330/02* (2013.01)

(58) Field of Classification Search
CPC ....... G09G 2310/0286; G09G 2310/08; G09G 3/3266; G11C 19/28
See application file for complete search history.

(56) References Cited

U.S. PATENT DOCUMENTS

2008/0218496 A1*   9/2008  Song ................... G09G 3/3688
                                                        345/204
2020/0042153 A1*   2/2020  Yang ................... G06F 3/0412

* cited by examiner

*Primary Examiner* — Insa Sadio
(74) *Attorney, Agent, or Firm* — Calfee, Halter & Griswold LLP

(57) ABSTRACT

The present disclosure provides a line drive signal enhancement circuit, a shift register unit, and a display panel, and relates to the technical field of display. The line drive signal enhancement circuit includes a control unit, an inverter unit, a first output unit and a second output unit. The control unit has a first peripheral control terminal and a second peripheral control terminal respectively loaded with two inverted signals, and the input terminal is electrically connected with the first power supply lead. The first output unit and the second output unit both have two input terminals. The two input terminals are respectively electrically connected with the first power supply lead and the second power supply lead. The output terminal of the control unit is electrically connected with the control terminal of the first output unit and/or the control terminal of the second output unit.

20 Claims, 21 Drawing Sheets

LINE DRIVE SIGNAL ENHANCEMENT CIRCUIT, SHIFT REGISTER UNIT, DISPLAY PANEL

CROSS REFERENCE TO RELATED APPLICATION

The present application is a 35 U.S.C. 371 national phase application of PCT International Application No. PCT/CN2021/097468 filed on May 31, 2021, the entire content of which is incorporated herein by reference in its entirety.

TECHNICAL FIELD

The present disclosure relates to the field of display technology, and in particular, to a line drive signal enhancement circuit, a shift register unit, and a display panel.

BACKGROUND

In a display panel, a scan signal can be loaded to the pixel drive circuit through the gate lead. Due to the load and impedance on the gate lead, a certain delay and voltage loss often occur when the scan signal reaches the pixel drive circuit. In a silicon-based Organic Electroluminescent Diode (OLED) display, due to the large pixel resolution, the delay and voltage drop loss of the scan signal on the gate lead are large. This results in different data voltages written by different pixel drive circuits, thereby reducing the display uniformity of the silicon-based OLED display.

It should be noted that the information disclosed in the above Background section is only for enhancement of understanding of the background of the present disclosure, and therefore may contain information that does not constitute the prior art that is already known to a person of ordinary skills in the art.

SUMMARY

According to an aspect of the present disclosure, there is provided a line drive signal enhancement circuit, including a control unit, an inverter unit, a first output unit and a second output unit.

The control unit has a first peripheral control terminal, a second peripheral control terminal, an input terminal and an output terminal. The input terminal of the control unit is electrically connected with the first power supply lead. The first peripheral control terminal and the second peripheral control terminal are configured to load two inverted signals respectively.

The first output unit has a control terminal, a first overall output terminal and two input terminals. The two input terminals are respectively electrically connected with the first power supply lead and the second power supply lead.

The second output unit has a control terminal, a second overall output terminal and two input terminals. The two input terminals are respectively electrically connected with the first power supply lead and the second power supply lead.

The output terminal of the control unit is electrically connected with the control terminal of the first output unit, and/or the output terminal of the control unit is electrically connected with the control terminal of the second output unit. One of the control terminal of the first output unit and the control terminal of the second output unit is electrically connected with the output terminal of the control unit through the inverter unit.

The input terminal of the control unit and the first power supply lead are electrically connected through at least two conductive materials.

According to an embodiment of the present disclosure, the first power supply lead is used for loading a first power supply voltage, and the second power supply lead is used for loading a second power supply voltage.

The control unit is configured to output the first power supply voltage to the first node or the second node under the control of the first peripheral control terminal and the second peripheral control terminal.

The inverter unit is connected with the first node and the second node, and is used for outputting the second power supply voltage to the second node in response to the first power supply voltage loaded on the first node, and is further used for outputting the second power supply voltage to the first node in response to the first power supply voltage loaded on the second node.

The first output unit is connected with the first node, and is configured to output one of the first power supply voltage and the second power supply voltage to the first overall output terminal under the control of the first node.

The second output unit is connected with the second node, for outputting the other of the first power supply voltage and the second power supply voltage to the second overall output terminal under the control of the second node.

According to an embodiment of the present disclosure, the control unit includes a first transistor and a second transistor.

The first transistor has an input terminal loaded with the first power supply voltage, an output terminal connected with the first node, and a control terminal serving as the first peripheral control terminal. The first transistor is used for outputting the first power supply voltage to the first node under the control of the control terminal of the first transistor.

The second transistor has an input terminal loaded with the first power supply voltage, an output terminal connected with the second node, and a control terminal serving as the second peripheral control terminal. The second transistor is used for outputting the first power supply voltage to the second node under the control of the control terminal of the second transistor.

The first transistor and the second transistor are both N-type transistors or both P-type transistors.

According to an embodiment of the present disclosure, the inverter unit includes a third transistor and a fourth transistor.

The third transistor has a control terminal connected with the first node, an input terminal loaded with the second power supply voltage, and an output terminal connected with the second node. The third transistor is used for outputting the second power supply voltage to the second node under the control of the first power supply voltage loaded on the first node.

The fourth transistor has a control terminal connected with the second node, an input terminal loaded with the second power supply voltage, and an output terminal connected with the first node. The fourth transistor is used for outputting the second power supply voltage to the first node under the control of the first power supply voltage loaded on the second node.

According to an embodiment of the present disclosure, the first output unit includes a fifth transistor and a sixth transistor.

The fifth transistor has a control terminal connected with the first node, an input terminal loaded with the first power supply voltage, and an output terminal connected with the first overall output terminal.

The sixth transistor has a control terminal connected with the first node, an input terminal loaded with the second power supply voltage, and an output terminal connected with the first overall output terminal.

The second output unit includes a seventh transistor and an eighth transistor.

The seventh transistor has a control terminal connected with the second node, an input terminal loaded with the first power supply voltage, and an output terminal connected with the second overall output terminal.

The eighth transistor has a control terminal connected with the second node, an input terminal loaded with the second power supply voltage, and an output terminal connected with the second overall output terminal.

The first terminal of the fifth transistor and the first terminal of the seventh transistor are used to load the first power supply voltage, and the first terminal of the sixth transistor and the first terminal of the eighth transistor are used for loading the second power supply voltage.

The transistor types of the fifth transistor and the seventh transistor are the same, the transistor types of the sixth transistor and the eighth transistor are the same, and the transistor types of the fifth transistor and the sixth transistor are different.

According to an aspect of the present disclosure, a shift register unit is provided, comprising a shift register, an inverter and the above-mentioned line drive signal enhancement circuit.

The shift register is used for outputting an initial scan signal to the input terminal of the inverter and the first overall control terminal of the line drive signal enhancement circuit. The output terminal of the inverter is connected with the second overall control terminal of the line drive signal enhancement circuit.

According to an aspect of the present disclosure, there is provided a display panel, comprising the above-mentioned shift register unit. The display panel includes a display area and a peripheral area surrounding the display area. The shift register unit is located in the periphery area. The line drive signal enhancement circuit is located between the shift register and the display area.

According to an embodiment of the present disclosure, the line drive signal enhancement circuit includes first to eighth transistors. The first transistor, the second transistor, the fifth transistor and the seventh transistor are N type transistors. The third transistor, the fourth transistor, the sixth transistor and the eighth transistor are P-type transistors.

According to an embodiment of the present disclosure, the peripheral area includes at least one line drive signal enhancement region provided with the first to eighth transistors.

The line drive signal enhancement region includes a P-type substrate region and an N-type substrate region. The P-type substrate region is located at a side of the N-type substrate region away from the display area. The N-type transistor is formed in the P-type substrate region, and the P-type transistor is formed in the N-type substrate region.

According to an embodiment of the present disclosure, the P-type substrate region includes a P-type auxiliary doped region, and further includes a first active region, a second active region, a fifth active region and a seventh active region isolated from each other.

The first active region and the fifth active region are arranged along a first direction, and the second active region and the seventh active region are arranged along the first direction. The first direction is parallel to the plane where the semiconductor substrate is located and is further perpendicular to an edge of the display area close to the shift regisgter unit.

The fifth active region and the seventh active region are arranged along a second direction, and the first active region and the second active region are arranged along the second direction. The second direction is parallel to the plane where the semiconductor substrate is located and is further perpendicular to the first direction.

The fifth active region and the seventh active region are respectively surrounded by the P-type auxiliary doped region. The first active region and the second active region are located at a side of the fifth active region and the seventh active region away from the display area. The first active region and the second active region are surrounded by the P-type auxiliary doped region together.

The first transistor is located in the first active region, the second transistor is located in the second active region, the fifth transistor is located in the fifth active region, and the seventh transistor is located in the seventh active region.

According to an embodiment of the present disclosure, the N-type substrate region includes an N-type auxiliary doped region, and further includes a third active region, a sixth active region, and an eighth active region isolated from each other.

The sixth active region and the eighth active region are arranged along the second direction, and the sixth active region and the eighth active region are respectively surrounded by the N-type auxiliary doped region. The third active region is located at a side of the sixth active region and the eighth active region away from the display area. The third active region is surrounded by the N-type auxiliary doped region.

The third transistor and the fourth transistor are located in the third active region, the sixth transistor is located in the sixth active region, and the eighth transistor is formed in the eighth active region.

According to an embodiment of the present disclosure, the display panel includes a semiconductor substrate. The semiconductor substrate is formed with active regions of the first to eighth transistors. The active region of each transistor includes a channel region, and a source and a drain on both sides of the channel region.

In the line drive signal enhancement region, the channel region of the transistor, the source of the transistor and the drain of the transistor all extend in a direction toward the display area.

According to an embodiment of the present disclosure, the display panel further includes a gate insulation layer and a gate layer sequentially stacked on the semiconductor substrate.

In the line drive signal enhancement region, the gate layer includes the gate of each transistor, and the gate of each transistor includes a gate region and a lead region connected with each other. The orthographic projection of the gate region of the gate of each transistor on the base substrate overlaps with the channel region of the transistor.

According to an embodiment of the present disclosure, the display panel further includes a first dielectric layer and a first metal wiring layer sequentially stacked on a side of the gate layer away from the semiconductor substrate.

In the line drive signal enhancement region, the first dielectric layer is provided with a first conductive column penetrating through the first dielectric layer and connected with the lead region of the gate of each transistor, and further provided with a second conductive column penetrating through the first dielectric layer and the gate insulation layer and connected with the semiconductor substrate.

In the line drive signal enhancement region, the first metal wiring layer includes first to third connection leads, and further includes gate connection lines, source connection lines and drain connection lines corresponding to the first to eighth transistors. Each of the drain connection lines includes a drain region and a connection region connected with each other.

In the line drive signal enhancement region, the gate connection line corresponding to each transistor is electrically connected with the lead region of the gate of the transistor through the first conductive column. The source connection line corresponding to each transistor is connected with the source of the transistor through the second conductive column. The drain region of the drain connection line corresponding to each transistor is connected with the drain of the transistor through the second conductive column.

The source connection lines corresponding to the first transistor and the second transistor are connected with the first connection lead. The source connection lines corresponding to the fifth transistor and the seventh transistor are connected with the first connection lead. The source connection lines corresponding to the sixth transistor and the eighth transistor are connected with the third connection lead. The connection region of the drain connection line corresponding to the third transistor is connected with the gate connection line corresponding to the fourth transistor. The connection region of the drain connection line corresponding to the fourth transistor is connected with the gate connection line corresponding to the third transistor.

According to an embodiment of the present disclosure, in the line drive signal enhancement region, the first metal wiring layer further includes fourth to sixth connection leads, a sixteenth connection lead and a seventeenth connection lead. The sixteenth connection lead is arranged along the wiring direction of the P-type auxiliary doped region, and is connected with the P-type auxiliary doped region through the second conductive column. The seventeenth connection lead is arranged along the N-type auxiliary doped region, and is connected with the N-type auxiliary doped region through the second conductive column. The first connection lead extends along the second direction and has both ends connected with the sixteenth connection lead. The second connection lead extends along the second direction and has both ends connected with the sixteenth connection lead. The third connection lead extends along the second direction and has both ends connected with the seventeenth connection lead. The fourth connection lead is connected with the gate connection line corresponding to the fifth transistor, and extends along the second direction. The fifth connection lead is located between the P-type substrate region and the N-type substrate region, and extends along the second direction. The sixth connection lead is connected with the connection region of the drain connection line corresponding to the fourth transistor, and extends along the second direction.

According to an embodiment of the present disclosure, the display panel further includes a second dielectric layer and a second metal wiring layer sequentially stacked on a side of the first metal wiring layer away from the semiconductor substrate.

The second dielectric layer is provided with a third conductive column penetrating through the second dielectric layer and connected with the first metal wiring layer. The second metal wiring layer is connected with the first metal wiring layer through the third conductive column.

In the line drive signal enhancement region, the second metal wiring layer includes seventh to thirteenth connection leads, a first power supply lead, a second power supply lead, a first control lead, a second control lead, a first output lead and a second output lead. Each lead extends along the first direction. The first control lead is connected with the gate connection line corresponding to the first transistor. The second control lead is connected with the gate connection line corresponding to the second transistor. The first power supply lead is connected with the first connection lead and the second connection lead. The second power supply lead is connected with the third connection lead. The seventh power supply lead is connected with the connection region of the drain connection line corresponding to the first transistor, and is further connected with the gate connection line corresponding to the fifth transistor. The eighth connection lead is connected with the connection region of the drain connection line corresponding to the second transistor, the gate connection line corresponding to the fourth transistor, the gate connection line corresponding to the seventh transistor, and the gate connection line corresponding to the eighth transistor. The ninth connection lead is connected with an end of the fourth connection lead away from the gate connection line corresponding to the fifth transistor, and is further connected with the gate connection line corresponding to the third transistor. The tenth connection lead is connected with the connection region of the drain connection line corresponding to the seventh transistor, and is further connected with the fifth connection lead. The eleventh connection lead is connected with the gate connection line corresponding to the sixth transistor, and is further connected with an end of the sixth connection lead away from the gate connection line corresponding to the third transistor. The twelfth connection lead is connected with the source connection line corresponding to the third transistor and the source connection line corresponding to the fourth transistor. The thirteenth connection lead is connected with the connection region of the drain connection line corresponding to the eighth transistor. The first output lead is connected with the connection region of the drain connection line corresponding to the fifth transistor, and is further connected with the connection region of the drain connection line corresponding to the sixth transistor. The second output lead is connected with the sixth connection lead.

According to an embodiment of the present disclosure, the display panel further includes a third dielectric layer and a third metal wiring layer sequentially stacked on a side of the second metal wiring layer away from the semiconductor substrate.

In the line drive signal enhancement region, the third dielectric layer is provided with a fourth conductive column penetrating through the third dielectric layer and connected with the second metal wiring layer. The third metal wiring layer is connected with the second metal wiring layer through the fourth conductive column. The third metal wiring layer includes a fourteenth connection lead and a fifteenth connection lead. The fourteenth connection lead is connected with the second power supply lead and the twelfth connection lead. The fifteenth connection lead is connected with the thirteenth connection lead and the second output lead.

According to an embodiment of the present disclosure, in the line drive signal enhancement region, the second metal wiring layer further includes an eighteenth connection lead extending along the first direction, and a nineteenth connection lead extending along the first direction. The third metal wiring layer further includes a twentieth connection lead. The eighteenth connection lead is connected with the sixteenth connection lead and the twentieth connection lead. The nineteenth connection lead is connected with the seventeenth connection lead and the fourteenth connection lead. The orthographic projection of the twentieth connection lead on the base substrate, covers the channel regions of the first transistor, the second transistor, the fifth transistor and the seventh transistor. The orthographic projection of the fourteenth connection lead on the base substrate, covers the channel regions of the third transistor, the fourth transistor, the sixth transistor and the eighth transistor.

According to an embodiment of the present disclosure, in the line drive signal enhancement region, the first power supply lead and the first connection lead are connected through a plurality of third conductive columns arranged in an array. The first power supply lead and the second connection lead are connected through a plurality of third conductive columns arranged in an array. The first power supply lead and the twentieth connection lead are connected through at least one group of fourth conductive columns, and the at least one group of fourth conductive columns includes a plurality of the fourth conductive columns arranged in an array. The second power supply lead and the third connection lead are connected through a plurality of third conductive columns arranged in an array. The second power supply lead and the fourteenth connection lead are connected through a plurality of fourth conductive columns arranged in an array.

According to an embodiment of the present disclosure, the source corresponding to the third transistor and the source corresponding to the fourth transistor coincides with each other; and the source connection line corresponding to the third transistor and the source connection line corresponding to the fourth transistor are multiplexed into the same lead.

According to an embodiment of the present disclosure, in the line drive signal enhancement region, the N-type substrate region further includes a fourth active region. The fourth active region and the third active region are arranged along the second direction. The third active region and the eighth active region are arranged along the first direction. The fourth active region and the sixth active region are arranged along the first direction. The display panel is provided with an auxiliary transistor in the fourth active region.

The active region of the auxiliary transistor is located in the fourth active region. The gate of the auxiliary transistor is located in the gate layer. The source connection line corresponding to the auxiliary transistor is located in the first metal wiring layer and connected with the source of the auxiliary transistor. The drain connection line corresponding to the auxiliary transistor is located in the first metal wiring layer and connected with the drain of the auxiliary transistor. The gate connection line corresponding to the auxiliary transistor is located in the first metal wiring layer and connected with the gate of the auxiliary transistor. The source connection line, the drain connection line and the gate connection line corresponding to the auxiliary transistor are connected with the seventeenth connection lead.

Other features and advantages of the present disclosure will become apparent from the following detailed description, or be learned in part by practice of the present disclosure.

It is to be understood that the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the present specification, illustrate embodiments consistent with the present disclosure and together with the description serve to explain the principle of the present disclosure. Obviously, the drawings in the following description are only some embodiments of the present disclosure. For those of ordinary skill in the art, other embodiments can also be obtained from these drawings without creative effort.

Figure 1:
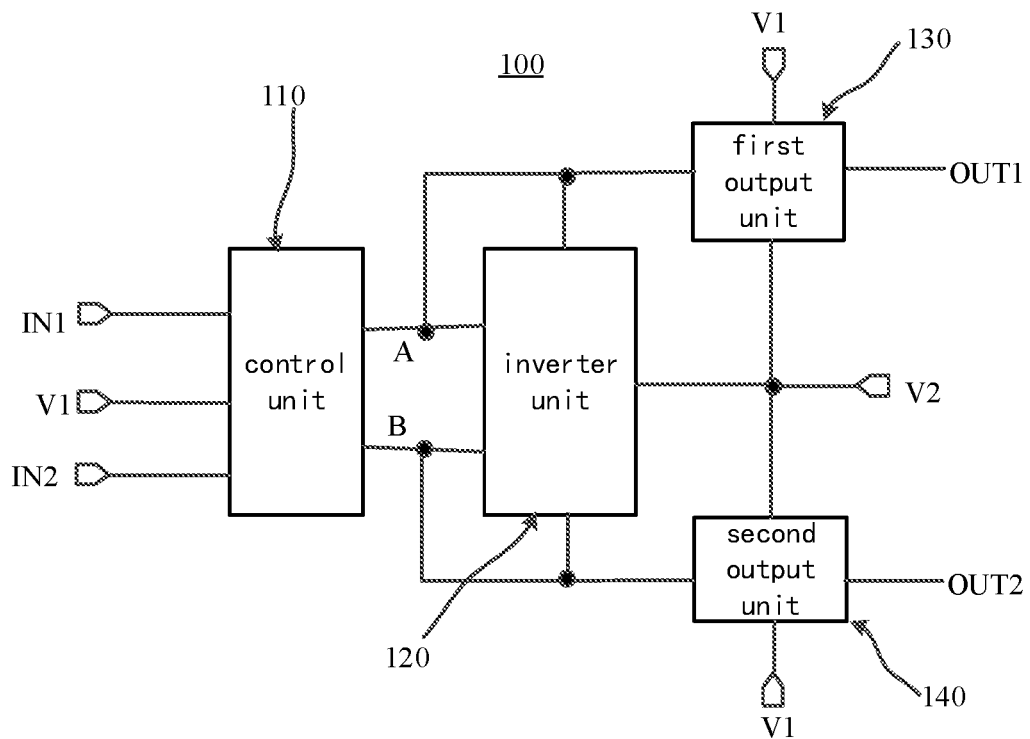
FIG. 1 is a schematic structural diagram of a line drive signal enhancement circuit according to an embodiment of the present disclosure.

In the drawings of the description, the reference numerals as used are mainly as follows.

100, line drive signal enhancement circuit; 110, control unit; IN1, first overall control terminal; IN2, second overall control terminal; 120, inverter unit; 130, first output unit; OUT1, first overall output terminal; 140. second output unit; OUT2, second overall output terminal; A, first node; B, second node; M1, first transistor; M2, second transistor; M3, third transistor; M4, fourth transistor; M5, fifth transistor; M6, sixth transistor; M7, seventh transistor; M8, eighth transistor; 210, shift register; 220, inverter; 300, pixel drive circuit; 310, data writing unit; M01, first switching transistor; M02, second switching transistor; Cst, storage capacitor; M03, drive transistor; F, third node; 400, semiconductor substrate; 401, first region; 402, second region; 410, P-type substrate region; 411, P-type auxiliary doped region; 420, N-type substrate region; 421, N-type auxiliary doped region; 431, first active region; 432, second active region; 433, third active region; 434, fourth active region; 435, fifth active region; 436, sixth active region; 437, seventh active region; 438, eighth active region; 4411, source of first transistor; 4412, drain of first transistor; 4413, channel region of first transistor; 4414, gate of first transistor; 4421, source of second transistor; 4422, drain of second transistor; 4423, channel region of second transistor; 4424, gate of second transistor; 4431, source of third transistor; 4432, drain of third transistor; 4433, channel region of third transistor; 4434, gate of third transistor; 4441, source of fourth transistor; 4442, drain of fourth transistor; 4443, channel region of fourth transistor; 4444, gate of fourth transistor; 4451, source of fifth transistor; 4452, drain of fifth transistor; 4453, channel region of fifth transistor; 4454, gate of fifth transistor; 4461, source of sixth transistor; 4462, drain of sixth transistor; 4463, channel region of sixth transistor; 4464, gate of sixth transistor; 4471, source of seventh transistor; 4472, drain of seventh transistor; 4473, channel region of seventh transistor; 4474, gate of seventh transistor; 4481, source of eighth transistor; 4482, drain of eighth transistor; 4483, channel region of eighth transistor; 4484, gate of eighth transistor; 510, gate insulation layer; 520, gate layer; 530, insulation dielectric layer; 531, first dielectric layer; 5311, first conductive column; 532, second dielectric layer; 5321, second conductive column; 533, third dielectric layer; 5331, third conductive column; 540, metal wiring layer; 541, first metal wiring layer; 542, second metal wiring layer; 543, third metal wiring layer; 6011, first power supply lead; 6012, second power supply lead; 6021, first control lead; 6022, second control lead; 6031, first output lead; 6032, second output lead; 611, source connection line corresponding to first transistor; 612, drain connection line corresponding to first transistor; 613, gate connection line corresponding to first transistor; 621, source connection line corresponding to second transistor; 622, drain connection line corresponding to second transistor; 623, gate connection line corresponding to second transistor; 631, source connection line corresponding to third transistor; 632, drain connection line corresponding to third transistor; 633, gate connection line corresponding to third transistor; 641, source connection line corresponding to fourth transistor; 642, drain connection line corresponding to fourth transistor; 643, gate connection line corresponding to fourth transistor; 651, source connection line corresponding to fifth transistor; 652, drain connection line corresponding to fifth transistor; 653, gate connection line corresponding to fifth transistor; 661, source connection line corresponding to sixth transistor; 662, drain connection line corresponding to sixth transistor; 671, source connection line corresponding to seventh transistor; 672, drain connection line corresponding to seventh transistor; 673, gate connection line corresponding to seventh transistor; 681, source connection line corresponding to eighth transistor; 682, drain connection line corresponding to eighth transistor; 683, gate connection line corresponding to eighth transistor; 701, first connection lead; 702, second connection lead; 703, third connection lead; 704, fourth connection lead; 705, fifth connection lead; 706, sixth connection lead; 707, seventh connection lead; 708, eighth connection lead; 709, ninth connection lead; 710, tenth connection lead; 711, eleventh connection lead; 712, twelfth connection lead; 713, thirteenth connection lead; 714, fourteenth connection lead; 715, fifteenth connection lead; 716, sixteenth connection lead; 717, seventeenth connection lead; 718, eighteenth connection lead; 719, nineteenth connection lead; 720, twentieth connection lead; C, display area; D, peripheral area; E, line drive signal enhancement region.

DETAILED DESCRIPTION OF THE EMBODIMENTS

Example embodiments will now be described more fully with reference to the accompanying drawings. Example embodiments, however, may be embodied in various forms and should not be construed as limited to the examples set forth herein. Rather, these embodiments are provided so that the present disclosure will be thorough and complete, and will fully convey the concept of example embodiments to those skilled in the art. The described features, structures, or characteristics may be combined in any suitable manner in one or more embodiments. In the following description, numerous specific details are provided in order to give a thorough understanding of embodiments of the present disclosure. However, those skilled in the art will appreciate that the technical solutions of the present disclosure may be practiced without one or more of the specific details, or other methods, components, devices, steps, etc. may be employed. In other instances, well-known solutions have not been shown or described in detail to avoid obscuring aspects of the present disclosure.

Furthermore, the drawings are merely schematic illustrations of the present disclosure, and are not necessarily drawn to scale. The same reference numerals in the drawings denote the same or similar parts, and thus their repeated descriptions will be omitted. Some of the block diagrams shown in the figures are functional entities that do not necessarily necessarily correspond to physically or logically separate entities. These functional entities may be implemented in software, or in one or more hardware modules or integrated circuits, or in different networks and/or processor devices and/or microcontroller devices.

The terms "a", "an", "the" and "said" are used to indicate the presence of one or more elements/components/etc. The terms "including" and "having" are used to indicate open inclusive and means that additional elements/components/etc may be present in addition to the listed elements/components/etc. The terms "first" and "second" etc. are used only as labels, not as limitations to the number of the relevant object.

Referring to FIG. 1, the present disclosure provides a line drive signal enhancement circuit 100, including a control unit 110, an inverter unit 120, a first output unit 130 and a second output unit 140.

The control unit 110 has a first peripheral control terminal IN1, a second peripheral control terminal IN2, an input terminal and an output terminal. The input terminal of the control unit is electrically connected with the first power supply lead. The first peripheral control terminal IN1 and the second peripheral control terminal IN2 is used to respectively load two inverted signals.

The first output unit 130 has a control terminal, a first overall output terminal OUT1 and two input terminals. The two input terminals are respectively electrically connected with the first power supply lead and the second power supply lead.

The second output unit 140 has a control terminal, a second overall output terminal OUT2 and two input terminals. The two input terminals are respectively electrically connected with the first power supply lead and the second power supply lead.

The output terminal of the control unit 110 is electrically connected with the control terminal of the first output unit 130, and/or the output terminal of the control unit 110 is electrically connected with the control terminal of the second output unit 140. One of the control terminal of the first output unit 130 and the control terminal of the second output unit 140 is electrically connected with the output terminal of the control unit 110 through the inverter unit 120.

The input terminal of the control unit 110 and the first power supply lead are electrically connected through at least two conductive materials.

In some embodiments, the first power supply lead is used for loading a first power supply voltage, and the second power supply lead is used for loading a second power supply voltage. Referring to FIG. 1, there are two output terminals of the control unit 110 and they are respectively connected with the first node and the second node.

In an embodiment, the control unit 110 has a first overall control terminal IN1 and a second overall control terminal IN2, for outputting the first power supply voltage V1 to the first node A or the second node B under the control of the first overall control terminal IN1 and the second overall control terminal IN2.

The inverter unit 120 connects the first node A and the second node B, and is used for outputting the second power supply voltage V2 to the second node B in response to the first power supply voltage V1 loaded on the first node A, and is further used for outputting the second power supply voltage V2 to the first node A in response to the first power supply voltage V1 loaded on the second node B.

The first output unit 130 is connected with the first node A and the first overall output terminal OUT1, for outputting one of the first power supply voltage V1 and the second power supply voltage V2 to the first overall output terminal OUT1 under the control of the first node A.

The second output unit 140 is connected with the second node B and the second overall output terminal OUT2, for outputting the other of the first power supply voltage V1 and the second power supply voltage V2 to the second overall output terminal OUT2 under the control of the second node B.

Figure 4:
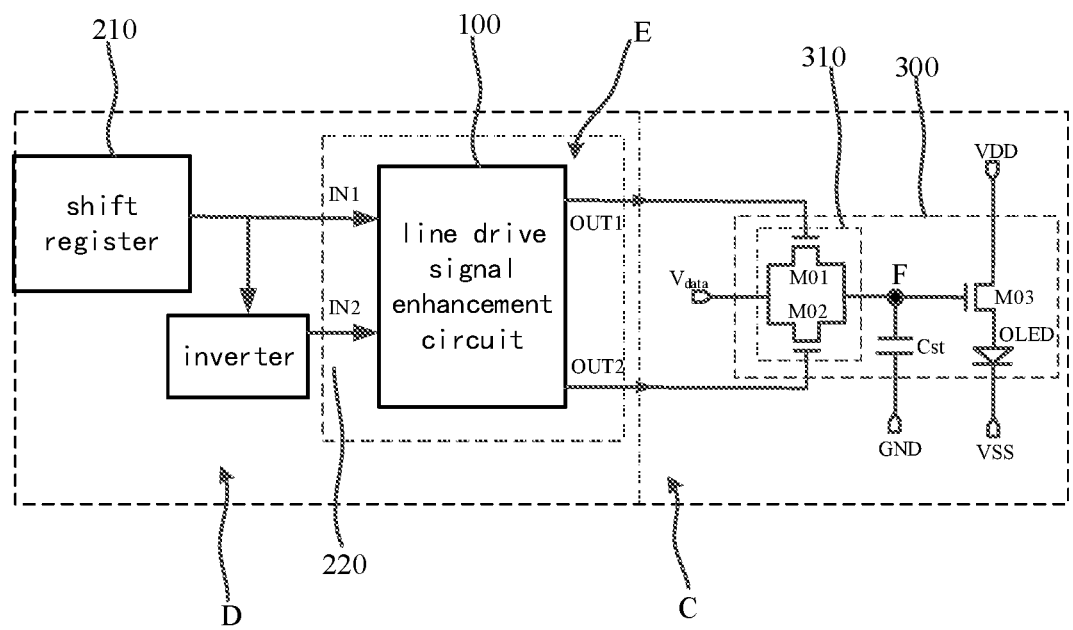
FIG. 4 is a schematic structural diagram of a display panel according to an embodiment of the present disclosure.

Referring to FIG. 4, the line drive signal enhancement circuit 100 provided by the present disclosure may form a shift register unit together with a shift register 210 and an inverter 220. The shift register 210 is used to output an initial scan signal (i.e., the first initial scan signal) to the input terminal of the inverter 220 and the first overall control terminal IN1 of the line drive signal enhancement circuit 100. The output terminal of the inverter 220 is connected with the second overall control terminal IN2 of the line drive signal enhancement circuit 100, so as to generate a second initial scan signal opposite to the first initial scan signal according to the first initial scan signal. In this way, the shift register 210 and the inverter 220 may respectively input two opposite initial scan signals (first initial scan signal and second initial scan signal) to the two control terminals of the control unit 110 of the line drive signal enhancement circuit 100. Based on the two opposite initial scan signals loaded on the first overall control terminal IN1 and the second overall control terminal IN2, the line drive signal enhancement circuit 100 enables the first output unit 130 and the second output unit 140 to output two different power supply voltages (first power supply voltage V1 and second power supply voltage V2) to be used as scan signals of the display panel, that is, outputting the scan signals formed by the first power supply voltage V1 and the second power supply voltage V2. The scan signals formed by the two power supply voltages may replace the initial scan signals generated by the shift register 210 and the inverter 220, so as to control the data writing unit 310 of the pixel drive circuit 300.

Therefore, the line drive signal enhancement circuit 100 provided by the present disclosure may convert an initial scan signal with a weaker drive capability into a scan signal formed by a power supply voltage with a stronger drive capability. This helps to overcome problems of large delay and voltage loss when the initial scan signal reaches the pixel drive circuit 300, thereby improving the display uniformity of the display panel, especially the display uniformity of the silicon-based OLED display.

Hereinafter, the structure, principle and effect of the line drive signal enhancement circuit 100 of the present disclosure will be further explained and described with reference to the accompanying drawings.

The line drive signal enhancement circuit 100 provided by the present disclosure is used to improve the line drive capability of the display panel, especially the line drive capability of the silicon-based OLED display. The line drive signal enhancement circuit 100 can generate two scan signals according to two initial scan signals of the display panel, where the scan voltages of the two scan signals are different power supply voltages. On one hand, a smaller voltage drop is involved during the transmission process on the scan lead. On the other hand, a larger signal transmission capacity is provided to meet the requirements of various loads on the scan line, and reduce the turn-on delay of each data writing unit 310. Therefore, the scan signal generated by the line drive signal enhancement circuit 100 has a stronger drive capability.

Optionally, in the line drive signal enhancement circuit 100, the first output unit 130 further includes a first input terminal and a second input terminal, the first input terminal of the first output unit 130 is electrically connected with the first power supply lead, and the second input terminal of the first output unit 130 is electrically connected with the second power supply lead. In this way, the first output unit 130 may directly output any one of the loaded first power supply voltage V1 and second power supply voltage V2 to the first overall output terminal OUT1, without generating the first power supply voltage V1 and the second power supply voltage V2 by means of voltage regulation. Thus, it is ensured that the signal output by the first overall output terminal OUT1 is not only the first power supply voltage V1 or the second power supply voltage V2 in voltage, but also can ensure that the scan signal output by the first overall output terminal OUT1 has a stronger drive capability, which meets the requirements of each load on each scan lead.

The second output unit 140 further includes a first input terminal and a second input terminal. The first input terminal of the second output unit 140 is electrically connected with the first power supply lead. The second input terminal of the second output unit 140 is electrically connected with the second power supply lead. In this way, the second output unit 140 may directly output any one of the loaded first power supply voltage V1 and second power supply voltage V2 to the second overall output terminal OUT2, without generating the first power supply voltage V1 and the second power supply voltage V2 by means of voltage regulation. Thereby, it is ensured that the signal output by the second overall output terminal OUT2 is not only the first power supply voltage V1 or the second power supply voltage V2 in voltage, but also can ensure that the scan signal output by the second overall output terminal OUT2 has a stronger drive capability, which meets the requirements of each load on each scan lead.

Optionally, the inverter unit 120 has at most two transistors. In this way, under the condition of ensuring the function of the line drive signal enhancement circuit 100, the number of transistors in the line drive signal enhancement circuit 100 may be reduced, the power consumption and area ratio of the line drive signal enhancement circuit 100 may be reduced, and the power consumption and area ratio of the display panel may be reduced as well.

Figure 2:
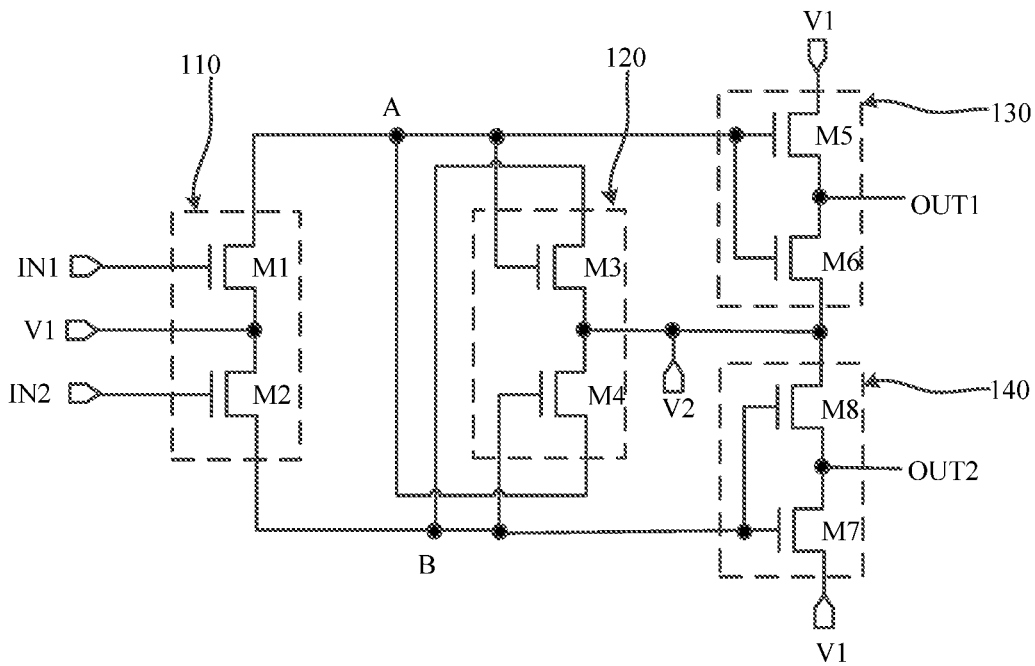
FIG. 2 is a schematic structural diagram of a line drive signal enhancement circuit according to an embodiment of the present disclosure.

Optionally, referring to FIG. 2, the control unit 110 includes a first transistor M1 and a second transistor M2.

The first transistor M1 has an input terminal loaded with the first power supply voltage V1 (electrically connected with the first power supply lead), an output terminal connected with the first node A, and a control terminal serving as the first overall control terminal IN1. The first transistor M1 is used for outputting the first power supply voltage V1 to the first node A under the control of the control terminal of the first transistor M1.

The second transistor M2 has an input terminal loaded with the first power supply voltage V1 (electrically connected with the first power supply lead), an output terminal connected with the second node B, and a control terminal serving as the second overall control terminal IN2. The second transistor M2 is used for outputting the first power supply voltage V1 to the second node B under the control of the control terminal of the second transistor M2.

The first transistor M1 and the second transistor M2 are both N-type transistors or both P-type transistors.

Figure 3:
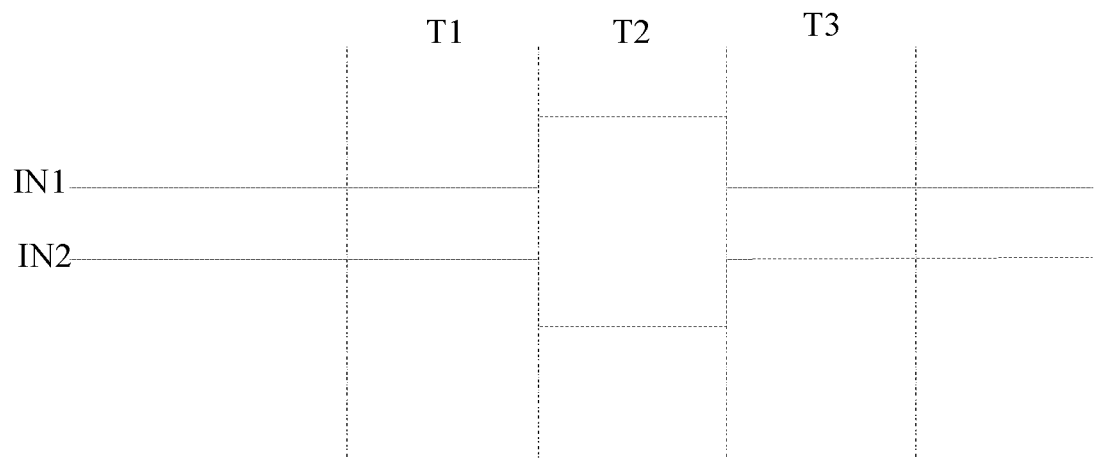
FIG. 3 is a timing diagram of signals applied to two control terminals of a line drive signal enhancement circuit according to an embodiment of the present disclosure.

Referring to FIG. 3, when the line drive signal enhancement circuit 100 of the present disclosure is in operation, the first overall control terminal IN1 and the second overall control terminal IN2 of the control unit 110 are respectively loaded with two opposite initial scan signals. Therefore, the control terminals of the first transistor M1 and the second transistor M2 are respectively loaded with two opposite initial scan signals. Since the first transistor M1 and the second transistor M2 are of the same type, i.e., they are both N-type transistors or P-type transistors, this not only facilitates the fabrication of transistors, but also enables the first transistor M1 and the second transistor M2 to be turned on alternatively. Thus, the control unit 110 alternatively outputs the first power supply voltage V1 to the first node A or the second node B.

In the following, the operation process of the control unit 110 will be described by taking an example where the first transistor M1 and the second transistor M2 are both N-type transistors, and the first initial scan signal output by the shift register unit is a high-level signal.

FIG. 3 is a timing diagram of two initial scan signals for the signals loaded on the first overall control terminal IN1 and the second overall control terminal IN2. Referring to FIG. 3, the first overall control terminal IN1 is loaded with a low-level base voltage in the T1 stage and the T3 stage, and is loaded with a high-level first initial scan signal in the T2 stage. The second overall control terminal IN2 is loaded with a high-level base voltage in the T1 stage and the T3 stage, and is loaded with a low-level second initial scan signal in the T2 stage. Therefore, the signals on the first overall control terminal IN1 and the second overall control terminal IN2 remain opposite, and one is at a high level while the other is at a low level.

In the T1 stage and the T3 stage, the first overall control terminal IN1 is loaded with a low-level signal and the second overall control terminal IN2 is loaded with a high-level signal. Thus, the second transistor M2 is turned on and the first transistor M1 is turned off, and the control unit 110 outputs the first power supply voltage V1 to the second node B. In the T2 stage, the first overall control terminal IN1 is loaded with a high-level signal and the second overall control terminal IN2 is loaded with a low-level signal. Thus, the first transistor M1 is turned on and the second transistor M2 is turned off, and the control unit 110 outputs the first power supply voltage V1 to the first node A.

Optionally, referring to FIG. 2, the inverter unit 120 includes a third transistor M3 and a fourth transistor M4.

The third transistor M3 has a control terminal connected with the first node A, an input terminal loaded with the second power supply voltage V2 (electrically connected with the second power supply lead), and an output terminal connected with the second node B. The third transistor M3 is used for outputting the second power supply voltage V2 to the second node B under the control of the first power supply voltage V1 loaded on the first node A.

The fourth transistor M4 has a control terminal connected with the second node B, an input terminal loaded with the second power supply voltage V2 (electrically connected with the second power supply lead), and an output terminal connected with the first node A. The fourth transistor M4 is used for outputting the second power supply voltage V2 to the first node A under the control of the first power supply voltage V1 loaded on the second node B.

Further, the first power supply voltage V1 is lower than the second power supply voltage V2, and the third transistor M3 and the fourth transistor M4 are P-type transistors. Alternatively, the first power supply voltage V1 is higher than the second power supply voltage V2, and the third transistor M3 and the fourth transistor M4 is N-type transistors. In other words, when the control terminals of the third transistor M3 and the fourth transistor M4 are loaded with the first power supply voltage V1, the third transistor M3 and the fourth transistor M4 can be turned on. When the control terminals of the third transistor M3 and the fourth transistor M4 are loaded with the second power supply voltage V2, the third transistor M3 and the fourth transistor M4 can be turned off.

Hereinafter, the operation process of the inverter unit 120 will be explained and illustrated by taking an example where the first power supply voltage V1 is lower than the second power supply voltage V2 and the third transistor M3 and the fourth transistor M4 are P-type transistors. When the control unit 110 loads the first power supply voltage V1 to the first node A, the control unit 110 does not load the voltage to the second node B. Under the control of the first node A, the third transistor M3 is turned on to output the second power supply voltage V2 to the second Node B. In this way, the first node A is loaded with the first power supply voltage V1, and the second node B is loaded with the second power supply voltage V2. On the contrary, when the control unit 110 loads the first power supply voltage V1 to the second node B, the control unit 110 does not load the voltage to the first node A. Under the control of the second node B, the third transistor M3 is turned on to output the second power supply voltage V2 to the first node A. In this way, the second node B is loaded with the first power supply voltage V1, and the first node A is loaded with the second power supply voltage V2. It can be seen from above that no matter what operation state the control unit 110 and the inverter unit 120 are in, two different power supply voltages are loaded on the first node A and the second node B.

Similarly, for the case where the first power supply voltage V1 is higher than the second power supply voltage V2, and the third transistor M3 and the fourth transistor M4 are N-type transistors, the first node A and the second node B may also be loaded with two different power supply voltages. The present disclosure will not describe its principles and processes in detail.

Optionally, referring to FIG. 2, the first output unit 130 includes a fifth transistor M5 and a sixth transistor M6.

The fifth transistor M5 has a control terminal connected with the first node A, an input terminal loaded with the first power supply voltage V1 (electrically connected with the first power supply lead), and an output terminal connected with the first overall output terminal OUT1.

The sixth transistor M6 has a control terminal connected with the first node A, an input terminal loaded with the second power supply voltage V2 (electrically connected with the second power supply lead), and an output terminal connected with the first overall output terminal OUT1.

One of the fifth transistor M5 and the sixth transistor M6 is an N-type transistor, and the other of the fifth transistor M5 and the sixth transistor M6 is a P-type transistor. In other words, one of the fifth transistor M5 and the sixth transistor M6 may be turned on in response to the first power supply voltage V1 loaded to the control terminal, and further turned off in response to the second power supply voltage V2 loaded to the control terminal. The other one of the fifth transistor M5 and the sixth transistor M6 may be turned off in response to the first power supply voltage V1 applied to the control terminal, and further turned on in response to the second power supply voltage V2 applied to the control terminal.

In an embodiment of the present disclosure, since the types of the fifth transistor M5 and the sixth transistor M6 are opposite, regardless of whether the first node A is loaded with the first power supply voltage V1 or the second power supply voltage V2, the fifth transistor M5 and the sixth transistor M6 may be turned on alternatively, so that the first power supply voltage V1 or the second power supply voltage V2 is loaded on the first overall output terminal OUT1.

Further, referring to FIG. 2, the second output unit 140 includes a seventh transistor M7 and a eighth transistor M8.

The seventh transistor M7 has a control terminal connected with the second node B, an input terminal loaded with the first power supply voltage V1 (electrically connected with the first power supply lead), and an output terminal connected with the second overall output terminal OUT2.

The eighth transistor M8 has a control terminal connected with the second node B, an input terminal loaded with the second power supply voltage V2 (electrically connected with the second power supply lead), and an output terminal connected with the second overall output terminal OUT2.

The fifth transistor M5 and the seventh transistor M7 are one of N-type transistors and P-type transistors, and the sixth transistor M6 and the eighth transistor M8 are the other of N-type transistors and P-type transistors.

In this way, one of the seventh transistor M7 and the eighth transistor M8 may be turned on in response to the first power supply voltage V1 applied to the control terminal, and further turned off in response to the second power supply voltage V2 applied to the control terminal. The other one of the seventh transistor M7 and the eighth transistor M8 may be turned off in response to the first power supply voltage V1 applied to the control terminal, and further turned on in response to the second power supply voltage V2 applied to the control terminal. Since the types of the seventh transistor M7 and the eighth transistor M8 are opposite, regardless of whether the second node B is loaded with the first power supply voltage V1 or the second power supply voltage V2, the seventh transistor M7 and the eighth transistor M8 may be turned on alternatively, so that the second overall output terminal OUT2 is loaded with the first power supply voltage V1 or the second power supply voltage V2.

The fifth transistor M5 and the seventh transistor M7 are of the same type. That is, both the fifth transistor M5 and the seventh transistor M7 may be turned on in response to the first power supply voltage V1 applied to the control terminal, or both may be turned on in response to the second power supply voltage V2 applied to the control terminal. Since the power supply voltages on the first node A and the second node B are different, i.e., one is the first power supply voltage V1 and the other is the second power supply voltage V2, one of the first overall output terminal OUT1 and the second overall output terminal OUT2 outputs the first power supply voltage V1, and the other of the first overall output terminal OUT1 and the second overall output terminal OUT2 outputs the second power supply voltage V2.

Optionally, the first transistor M1 to the eighth transistor M8 are Metal Oxide Semiconductor (MOS) transistors.

Below, a line drive signal enhancement circuit 100 and its operation process are exemplarily introduced, so as to further explain and illustrate the principle, structure and effect of the line drive signal enhancement circuit 100 according to an embodiment of the present disclosure.

Referring to FIG. 2, the exemplary line drive signal enhancement circuit 100 includes a control unit 110, an inverter unit 120, a first output unit 130 and a second output unit 140.

The control unit 110 includes a first transistor M1 and a second transistor M2. The first transistor M1 has an input terminal loaded with a first power supply voltage V1, an output terminal connected with the first node A, and a control terminal serving as the first overall control terminal IN1. The second transistor M2 has an input terminal loaded with the first power supply voltage V1, an output terminal connected with the second node B, and a control terminal serving as a second overall control terminal IN2. The inverter unit 120 includes a third transistor M3 and a fourth transistor M4. The third transistor M3 has a control terminal connected with the first node A, an input terminal loaded with the second power supply voltage V2, and an output terminal connected with the second node B. The fourth transistor M4 has a control terminal connected with the second node B, an input terminal loaded with the second power supply voltage V2, and an output terminal connected with the first node A.

The first output unit 130 includes a fifth transistor M5 and a sixth transistor M6. The fifth transistor M5 has a control terminal connected with the first node A, an input terminal loaded with the first power supply voltage V1, and an output terminal connected with the first overall output terminal OUT1. The sixth transistor M6 has a control terminal connected with the first node A, an input terminal loaded with the second power supply voltage V2, and an output terminal connected with the first overall output terminal OUT1. The second output unit 140 includes a seventh transistor M7 and an eighth transistor M8. The seventh transistor M7 has a control terminal connected with the second node B, an input terminal loaded with the first power supply voltage V1, and an output terminal connected with the second overall output terminal OUT2. The eighth transistor M8 has a control terminal connected with the second node B, an input terminal loaded with the second power supply voltage V2, and an output terminal connected with the second overall output terminal OUT2.

The first transistor M1, the second transistor M2, the fifth transistor M5 and the seventh transistor M7 are N-type transistors. The third transistor M3, the fourth transistor M4, the sixth transistor M6 and the eighth transistor M8 are P-type transistors. The first power supply voltage V1 is lower than the second power supply voltage V2. Any N-type transistor may be turned on in response to the second power supply voltage V2 applied to its control terminal, and may be turned off in response to the first power supply voltage V1 applied to its control terminal. Any P-type transistor may be turned on in response to the first power supply voltage V1 applied to its control terminal, and may be turned off in response to the second power supply voltage V2 applied to its control terminal.

Reference may be made to the timing diagram shown in FIG. 3. In the T1 stage, the first overall control terminal IN1 is loaded with a low-level signal and the second overall control terminal IN2 is loaded with a high-level signal. Therefore, the first transistor M1 is turned off, and the second transistor M2 is turned on, so as to load the second node B with the first power supply voltage V1. Under the control of the second node B, the fourth transistor M4 is turned on to output the second power supply voltage V2 to the first node A, and the third transistor M3 is turned off under the control of the first node A. In this way, the first node A is loaded with the second power supply voltage V2 and the second node B is loaded with the first power supply voltage V1. Under the control of the first node A, the fifth transistor 1\45 is turned on and the sixth transistor M6 is turned off, so that the first power supply voltage V1 is loaded to the first overall output terminal OUT1. Under the control of the second node B, the eighth transistor M8 is turned on and the seventh transistor M7 is turned off, so that the second power supply voltage V2 is applied to the second overall output terminal OUT2.

In the T2 stage, the first overall control terminal IN1 is loaded with a high-level signal and the second overall control terminal IN2 is loaded with a low-level signal. Therefore, the second transistor M2 is turned off, and the first transistor M1 is turned on, so as to load the first node A with the first power supply voltage V1. Under the control of the first node A, the third transistor M3 is turned on to output the second power supply voltage V2 to the second node B, and the fourth transistor M4 is turned off under the control of the first node A. In this way, the first node A is loaded with the first power supply voltage V1 and the second node B is loaded with the second power supply voltage V2. Under the control of the first node A, the sixth transistor M6 is turned on and the fifth transistor M5 is turned off, so that the second power supply voltage V2 is loaded to the first overall output terminal OUT1. Under the control of the second node B, the seventh transistor M7 is turned on and the eighth transistor M8 is turned off, so that the first power supply voltage V1 is applied to the second overall output terminal OUT2.

Accordingly, in the T3 stage, the first overall output terminal OUT1 is loaded with the first power supply voltage V1, and the second overall output terminal OUT2 is loaded with the second power supply voltage V2.

Optionally, in some embodiments, one of the first power supply voltage V1 and the second power supply voltage V2 may be the ground voltage (GND), and the other of the first power supply voltage V1 and the second power supply voltage V2 may be the voltage (VDD) applied to the source of the drive transistor M03 by the pixel drive circuit 300 during the light-emitting phase. Preferably, the first power supply voltage V1 is the ground voltage (GND).

Embodiments of the present disclosure further provide a shift register unit. With reference to FIG. 4, the shift register unit includes any one of the line drive signal enhancement circuits 100 described in the above embodiments of the line drive signal enhancement circuit 100, and further includes a shift register 210 and an inverter 220. The shift register 210 is used for outputting an initial scan signal to the input terminal of the inverter 220 and the first overall control terminal IN1 of the line drive signal enhancement circuit 100. The output terminal of the inverter 220 is connected with the second overall control terminal IN2 of the line drive signal enhancement circuit 100. The shift register unit may generate an initial scan signal, and then use the power supply voltage to convert the initial scan signal into a scan signal. The scan voltage and the base voltage of the scan signal are different power supply voltages, thereby improving the drive capability of the scan signal, and overcoming defects such as large delay and large voltage drop of the scan signal on the scan lead.

Since the shift register unit has any one of the line drive signal enhancement circuits 100 described in the above embodiments of the line drive signal enhancement circuit 100, it has the same beneficial effects, and details are not described herein again.

Embodiments of the present disclosure further provide a display panel. The display panel includes any of the shift register units described in the above-described shift register unit embodiments. The display panel may be an Organic Light Emitting Diode (OLED) display panel, a liquid crystal display panel, a Micro Light Emitting Diode (Micro LED) display panel, or other types of display panels, especially a silicon-based OLED display panel, or a silicon-based liquid crystal display panel. Since the display panel has any of the shift register units described in the above-mentioned shift register unit embodiments, it has the same beneficial effects, and details are not described here in the present disclosure.

In an embodiment of the present disclosure, the display panel includes a display area and a peripheral area surrounding the display area. The shift register unit is located in the peripheral area, and the line drive signal enhancement circuit is located between the shift register and the display area.

Figure 23:
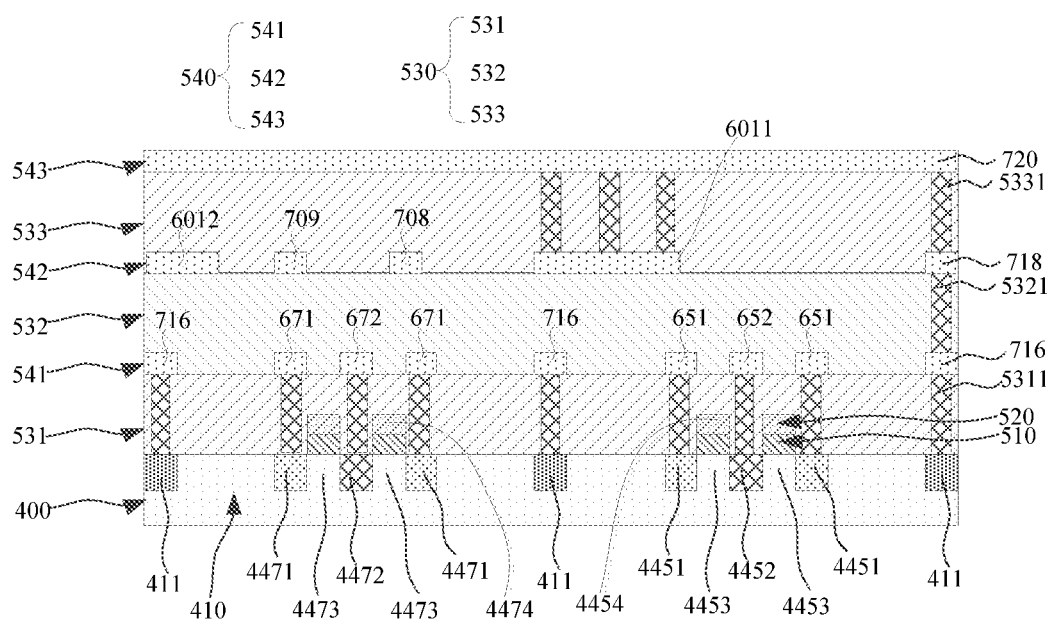
FIG. 23 is a schematic structural view when cut along the MM' direction of FIG. 22.

In some embodiments, the display panel may include a drive backplane and a display layer stacked on the drive backplane. With reference to FIG. 23, the drive backplane includes a semiconductor substrate 400, a gate insulation layer 510, a gate layer 520, an insulation dielectric layer 530 and a metal wiring layer 540 which are stacked in sequence. Referring to FIG. 4, the display panel includes a display area C and a peripheral area D surrounding the display area C, where a plurality of line drive signal enhancement regions E are arranged in the peripheral region D. In any one of the line drive signal enhancement regions E, the display panel is provided with the line drive signal enhancement circuit 100 including a first transistor M1 to an eighth transistor M8.

Figure 5:
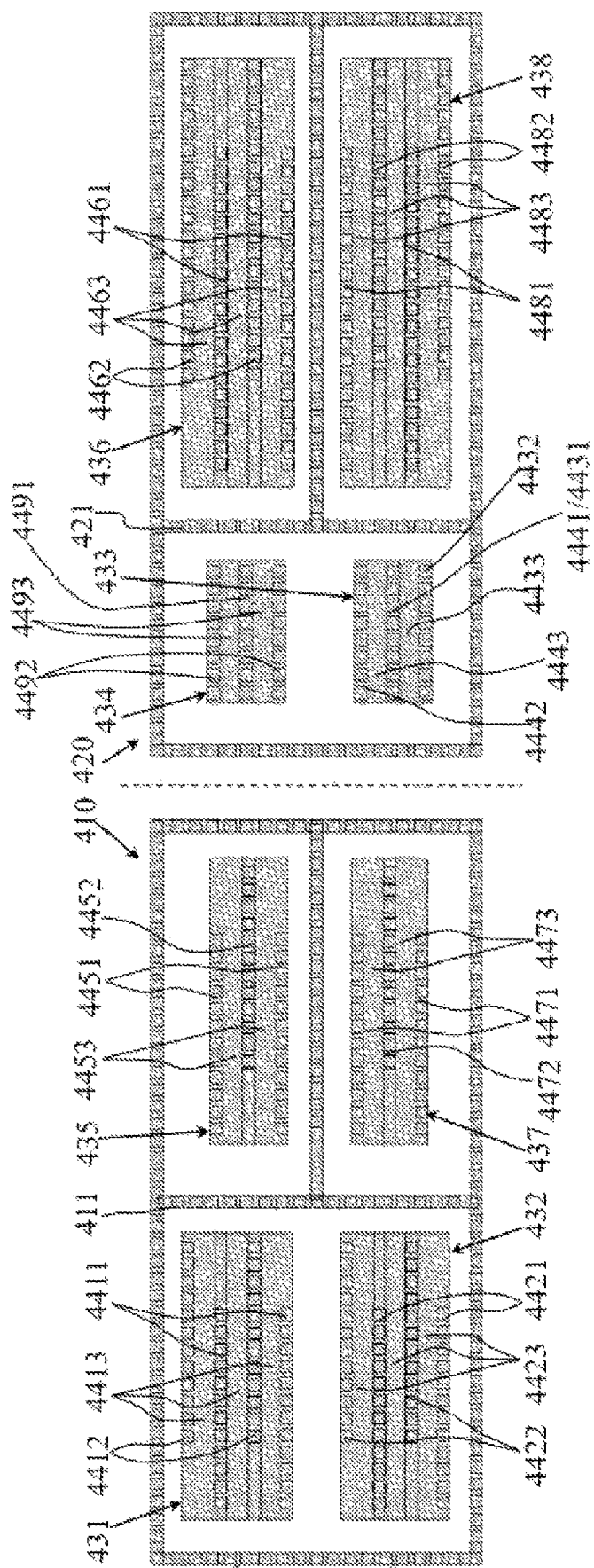
FIG. 5 is a schematic structural diagram of a semiconductor substrate according to an embodiment of the present disclosure.

FIG. 5 is a schematic structural diagram of the semiconductor substrate 400 in the line drive signal enhancement region E. As shown in FIG. 5, only positions of the active regions of the respective transistors are shown, and positions of the N-type doped regions and the P-type doped regions of the line drive signal enhancement region E are not shown.

Referring to FIG. 5, the semiconductor substrate 400 is formed with active regions of the first transistor M1 to the eighth transistor M8, and the active region of any one of the transistors includes a channel region, and a source and a drain on both sides of the channel region. The first transistor M1 and the second transistor M2 are both N-type transistors (or both P-type transistors). The fifth transistor M5 and the seventh transistor M7 are both N-type transistors (or both P-type transistors). The sixth transistor M6 and the eighth transistor M8 are both N-type transistors (or both P-type transistors). One of the fifth transistor M5 and the sixth transistor M6 is an N-type transistor, and the other of the fifth transistor M5 and the sixth transistor M6 is a P-type transistor. The third transistor M3 and the fourth transistor M4 are both N-type transistors (or both P-type transistors).

Preferably, the semiconductor substrate 400 may be a silicon-based semiconductor substrate, especially a single crystal silicon semiconductor substrate.

Figure 7:
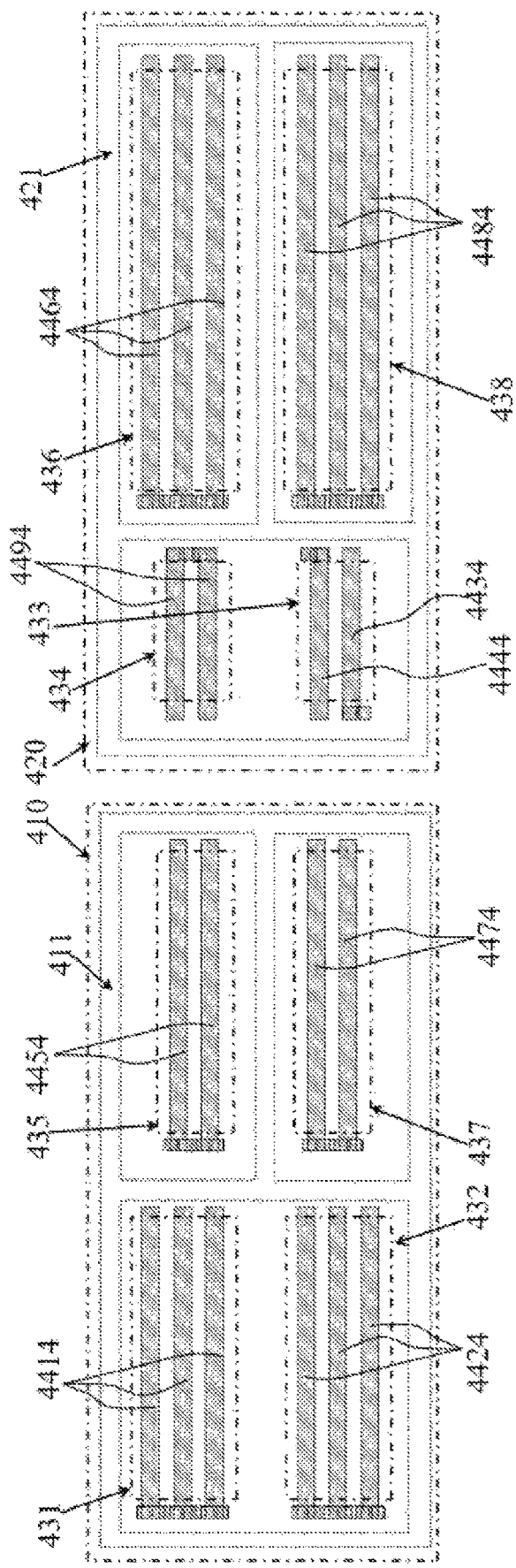
FIG. 7 is a schematic structural diagram of a gate layer according to an embodiment of the present disclosure.
Figure 12:
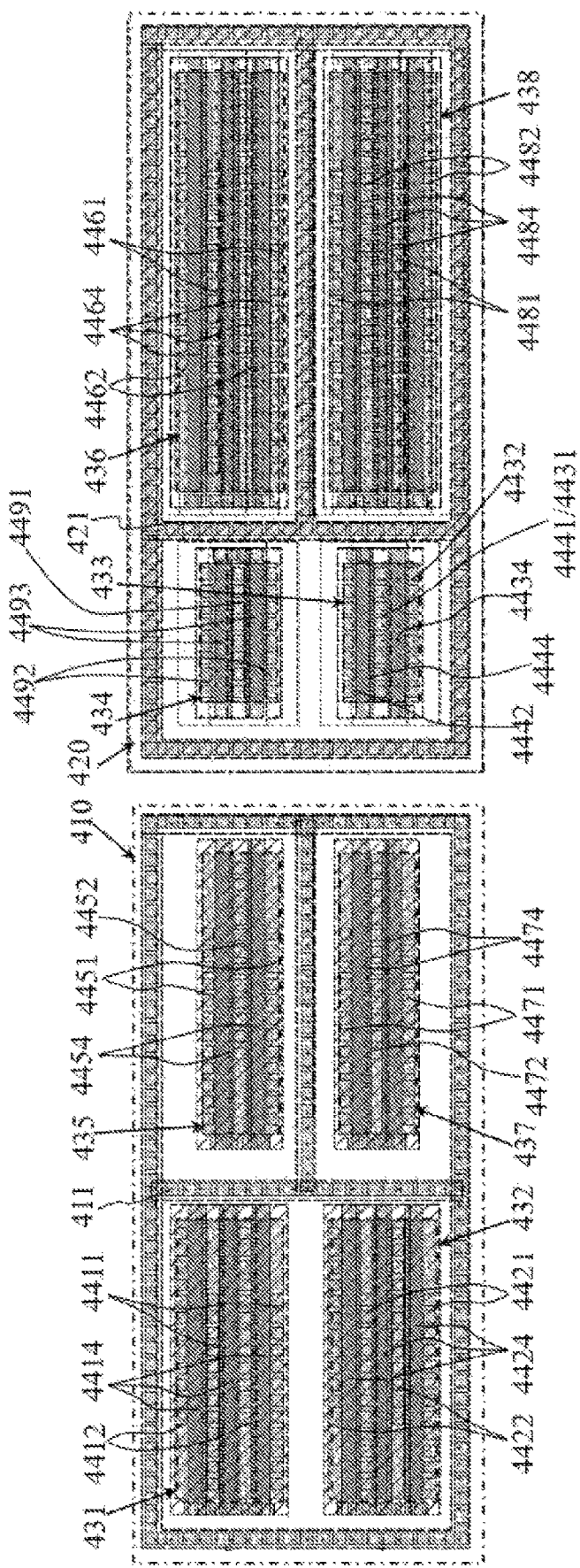
FIG. 12 is a schematic position diagram of each crystal in the line drive signal enhancement region according to an embodiment of the present disclosure.

Referring to FIGS. 7, 12 and 23, the gate layer 520 is formed with the gates of the first to eighth transistors M1 to M8, and the gate insulation layer 510 isolates the gate and the channel region of any one of the transistors.

Referring to FIG. 23, the insulation dielectric layer 530 covers the gate layer 520.

Referring to FIGS. 13 to 22, the metal wiring layer 540 includes connection leads, a first power supply lead 6011, a second power supply lead 6012, a first control lead 6021, a second control lead 6022, a first output lead 6031 and a second output lead 6032. The connection leads are electrically connected with the source, drain and gate of each transistor through conductive columns located in the insulation dielectric layer 530. The connection leads enable the source 4411 of the first transistor M1, the source 4421 of the second transistor M2, the source 4451 of the fifth transistor M5 and the source 4471 of the seventh transistor M7 to be electrically connected with the first power supply lead 6011. Further, the connection leads enable the source 4431 of the third transistor M3, the source 4441 of the fourth transistor M4, the source 4461 of the sixth transistor M6, and the source 4481 of the eighth transistor M8 to be electrically connected with the second power supply lead 6012. Further, the connection leads enable the drain 4412 of the first transistor M1, the drain 4442 of the fourth transistor M4, the gate 4434 of the third transistor M3, the gate 4454 of the fifth transistor M5, and the gate 4464 of the sixth transistor M6 to be electrically connected with each other. Further, the connection leads enable the drain 4422 of the second transistor M2, the drain 4432 of the third transistor M3, the gate 4444 of the fourth transistor M4, the gate 4474 of the seventh transistor M7, and the gate 4484 of the eighth transistor M8 to be electrically connected with each other. Further, the connection leads enable the gate 4414 of the first transistor M1 to be electrically connected with the first control lead 6021, and enable the gate 4424 of the second transistor M2 to be electrically connected with the second control lead 6022. Besides, the connection leads enable the drain 4452 of the fifth transistor M5 and the drain of the sixth transistor M6 to be electrically connected with the first output lead 6031, and further enable the drain 4472 of the seventh transistor M7 and the drain 4482 of the eighth transistor M8 to be electrically connected with the first output lead 6031.

In this way, in the display panel according to an emobodiment of the present disclosure, the equivalent circuit of the line drive signal enhancement circuit 100 is shown in FIG. 2. The operation process and effects of the line drive signal enhancement circuit 100 are described in detail in the above-mentioned embodiments of the line drive signal enhancement circuit 100, and will not be repeated here. The display panel is provided with the line drive signal enhancement circuit 100, so that the line drive capability of the display panel is improved, and the display uniformity of the display panel is improved.

In the display panel provided by an emdbodiment of the present disclosure, the first power supply lead 6011 may be loaded with the first power supply voltage V1, and the second power supply lead 6012 may be loaded with the second power supply voltage V2. The first control lead 6021 may be used as the first overall control terminal IN1 of the line drive signal enhancement circuit 100, and the second control lead 6022 may be used as the second overall control terminal IN2 of the line drive signal enhancement circuit 100. The first output lead 6031 may be used as the first overall output terminal OUT1 of the line drive signal enhancement circuit 100, and the second output lead 6032 may be used as the second overall output terminal OUT2 of the line drive signal enhancement circuit 100.

In an embodiment of the present disclosure, the first transistor M1, the second transistor M2, the fifth transistor M5 and the seventh transistor M7 are N-type transistors; and the third transistor M3, the fourth transistor M4, the sixth transistor M6 and the eighth transistor M8 are P-type transistors. In this way, each transistor may be formed by a Complementary Metal Oxide Semiconductor (CMOS) process, without introducing an additional process to increase the cost of the display panel.

Optionally, referring to FIG. 5, any one of the line drive signal enhancement regions E includes a P-type substrate region 410 and an N-type substrate region 420. The P-type substrate region 410 is located on the side of the N-type substrate region 420 away from the display region C. The N-type transistor is formed in the P-type substrate region 410, and the P-type transistor is formed in the N-type substrate region 420.

Further optionally, referring to FIG. 5, the P-type substrate region 410 includes a P-type auxiliary doped region 411, and further includes a first active region 431, a second active region 432, a fifth active region 435 and a seventh active region 437 isolated from each other. The fifth active region 435 and the seventh active region 437 are arranged in a direction extending parallel to the edge of the display area C (especially extending along the column edge of the display area C). The fifth active region 435 and the seventh active region 437 are respectively surrounded by the P-type auxiliary doped region 411. The first active region 431 and the second active region 432 are arranged along a direction extending parallel to the edge of the display area C, and are located at the side of the fifth active region 435 and the seventh active region 437 away from the display area C. The first active region 431 and the second active region 432 are surrounded by the P-type auxiliary doped region 411 together. That is, no P-type auxiliary doped region 411 is provided between the first active region 431 and the second active region 432. The first transistor M1 is located in the first active region 431, the second transistor M2 is located in the second active region 432, the fifth transistor M5 is located in the fifth active region 435, and the seventh transistor M7 is located in the seventh active region 437.

In this way, the arrangement of transistors helps to improve the compactness of the arrangement of transistors, reduce the area ratio of the line drive signal enhancement circuit 100 and the length of the connection leads, and reduce the power consumption of the line drive signal enhancement circuit 100. Besides, the P-type auxiliary doped region 411 helps to reduce the leakage of each transistor, and further reduce the power consumption of the line drive signal enhancement circuit 100.

Optionally, referring to FIG. 5, the N-type substrate region 420 includes an N-type auxiliary doped region 421, and further includes a third active region 433, a sixth active region 436, and an eighth active region 438 isolated from each other. The sixth active region 436 and the eighth active region 438 are arranged along a direction extending parallel to the edge of the display area C. The sixth active region 436 and the eighth active region 438 are surrounded by the N-type auxiliary doped region 421 respectively. The third active region 433 is located at the side of the sixth active region 436 and the eighth active region 438 away from the display area C. The third active region 433 is surrounded by the N-type auxiliary doped region 421. The third transistor M3 and the fourth transistor M4 are located in the third active region 433, the sixth transistor M6 is located in the sixth active region 436, and the eighth transistor M8 is formed in the eighth active region 438.

In this way, the arrangement of transistors helps to improve the compactness of the arrangement of transistors, reduce the area ratio of the line drive signal enhancement circuit 100 and the length of the connection leads, and reduce the power consumption of the line drive signal enhancement circuit 100. Besides, the N-type auxiliary doped region 421 helsp to reduce the leakage of each transistor, and further reduce the power consumption of the line drive signal enhancement circuit 100.

Further, the third transistor M3 and the fourth transistor M4 may share the same source. In this way, the connection by connection leads between the source 4431 of the third transistor M3 and the source 4441 of the fourth transistor M4 may be avoided, which further improves the compactness of the line drive signal enhancement circuit 100. Furthermore, the N-type substrate region 420 may further include a fourth active region 434, adjacent to the third active region 433 and surrounded by the N-type auxiliary doped region 421 together with the third active region 433. An auxiliary transistor is formed in the fourth active region 434 to improve the uniformity during the fabrication process of the line drive signal enhancement circuit 100. Preferably, in the fourth active region 434, the source 4491, the drain 4492, and the gate 4494 of the auxiliary transistor are electrically connected with each other. The gate 4494 of the auxiliary transistor and the channel region 4493 of the auxiliary transistor at least partially overlap.

Exemplarily, in an embodiment of the present disclosure, in any line drive signal enhancement region E, the sixth transistor M6, the auxiliary transistor, the fifth transistor M5 and the first transistor M1 are arranged along a straight line in a direction away from the display area C. The eighth transistor M8, the third transistor M3 and the fourth transistor M4 as a whole, together with the seventh transistor M7 and the second transistor M2, are arranged along a straight line in a direction away from the display area C.

When forming each transistor, a CMOS process may be used for preparation. Exemplarily, each transistor of the line drive signal enhancement circuit 100 may be formed in the line drive signal enhancement region E by the following method.

Figure 6:
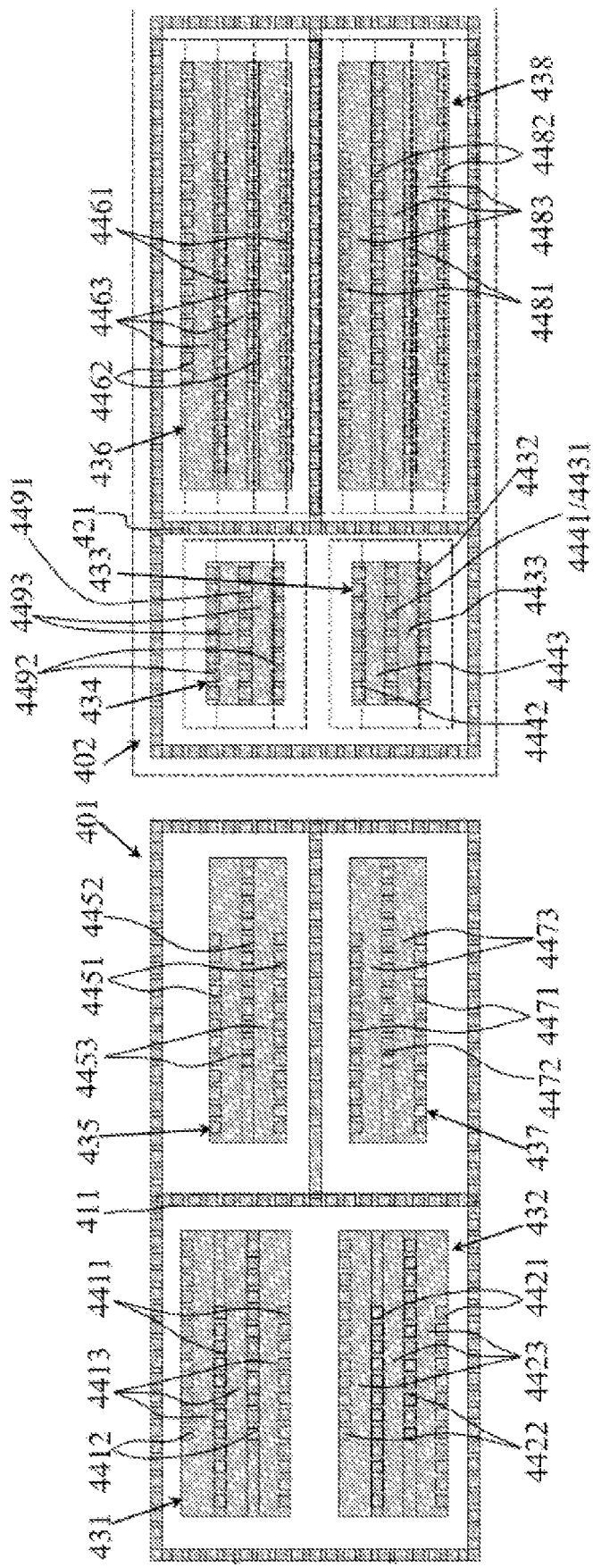
FIG. 6 is a schematic structural diagram of N-doping a semiconductor substrate to form an N-well according to an embodiment of the present disclosure.

Referring to FIG. 6, a P-type semiconductor substrate 400 may be provided first, and the P-type semiconductor substrate 400 has a first region 401 and a second region 402 in the line drive signal enhancement region E. The first region 401 may be used as a P-type substrate region 410, which has a P-well. N-type ions may be implanted in the second region 402 to form an N-well in the second region 402, serving as the N-type substrate region 420.

Then, referring to FIG. 7, a gate insulation layer 510 (not shown in FIG. 7) and a gate layer 520 may be formed. Referring to FIG. 12, the gate insulation layer 510 and the gate layer 520 cover the channel region of each transistor, and expose the source and drain of each transistor. The material of the gate insulation layer 510 may be inorganic insulation materials such as silicon oxide, silicon nitride, and silicon oxynitride. The material of the gate layer 520 may be polysilicon.

Figure 8:
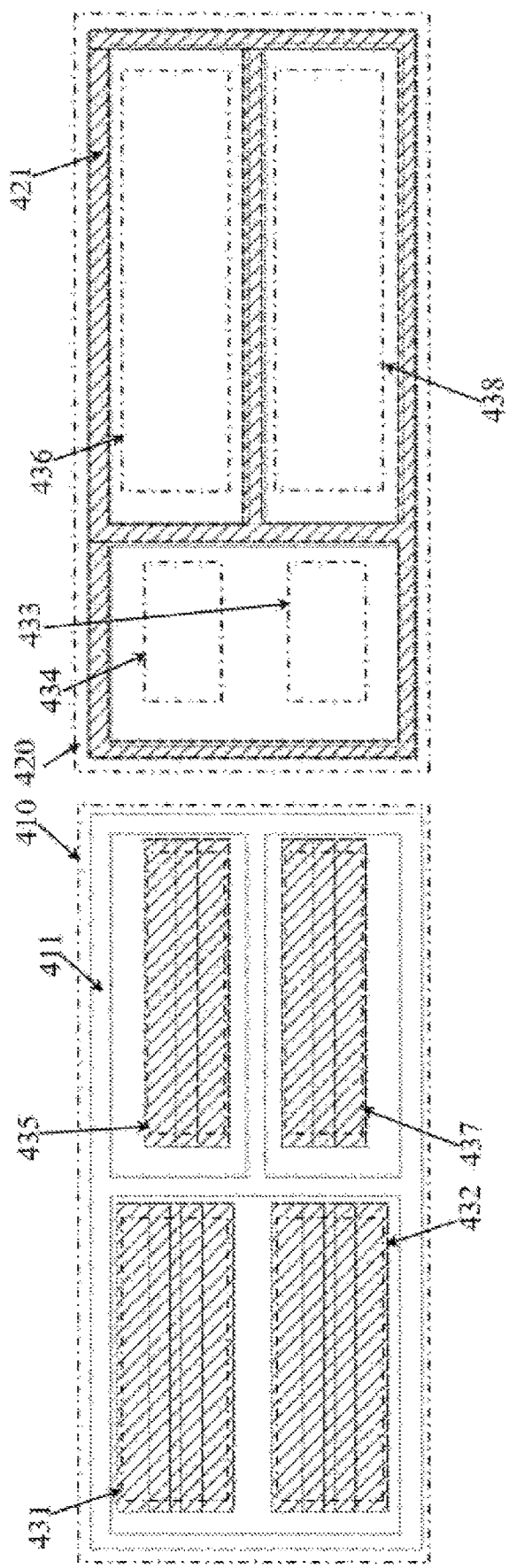
FIG. 8 is a schematic structural diagram of N doping according to an embodiment of the present disclosure.
Figure 9:
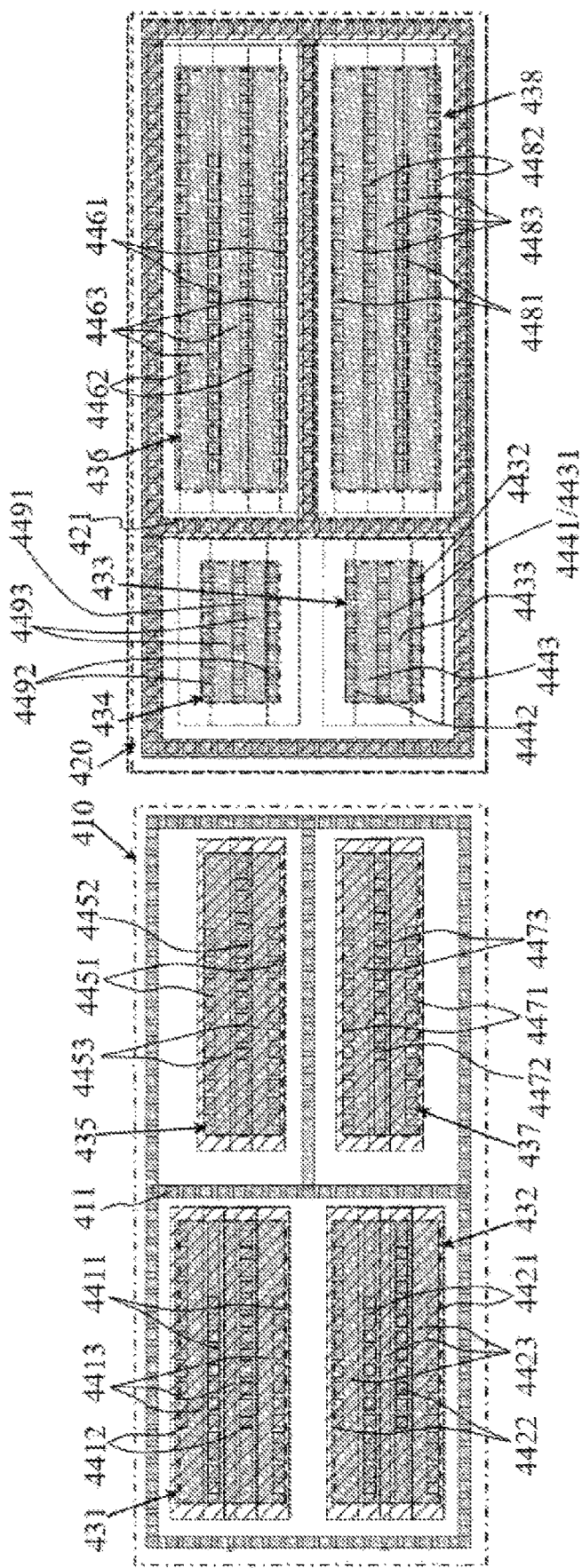
FIG. 9 is a schematic position diagram of the N-doped region on the semiconductor substrate according to an embodiment of the present disclosure.

Referring to FIGS. 8 and 9, N-type ion implantation may be performed on each active region of the P-type substrate region 410 and the N-type auxiliary doped region 421 of the N-type substrate region 420. In this way, the source and drain of each transistor located in the P-type substrate region 410 are transformed into N-type doped, and then each N-type transistor is formed in the P-type substrate region 410. When the doping concentration of the N-type auxiliary doped region 421 increases, a better anti-leakage effect is provided.

Figure 10:
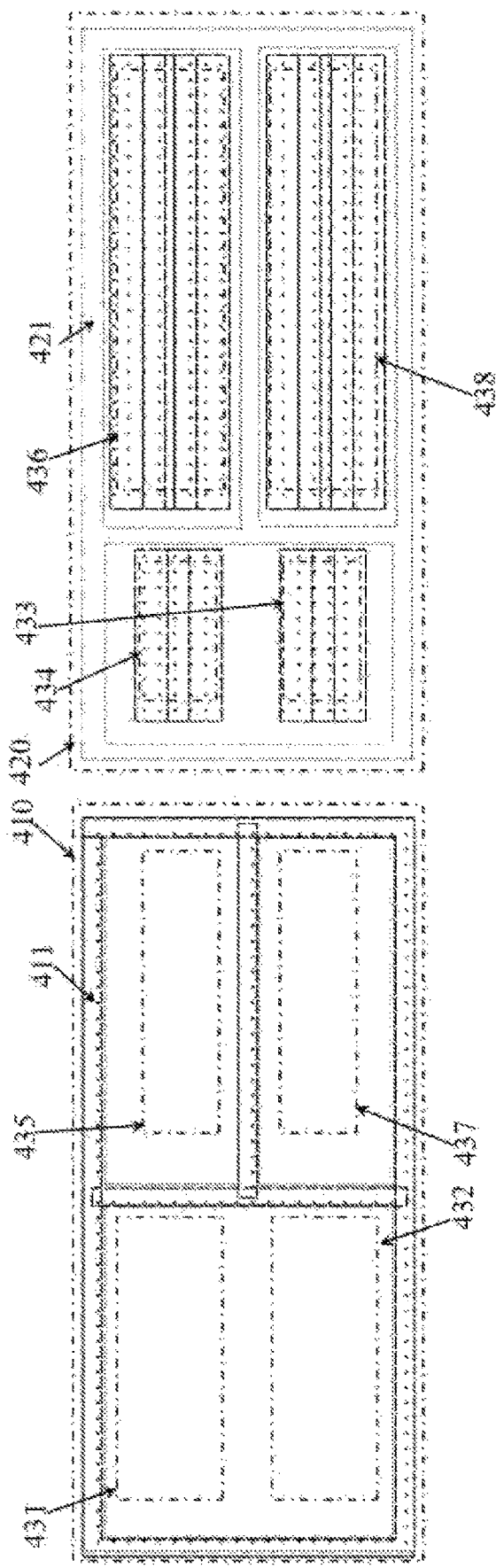
FIG. 10 is a schematic structural diagram of P doping according to an embodiment of the present disclosure.
Figure 11:
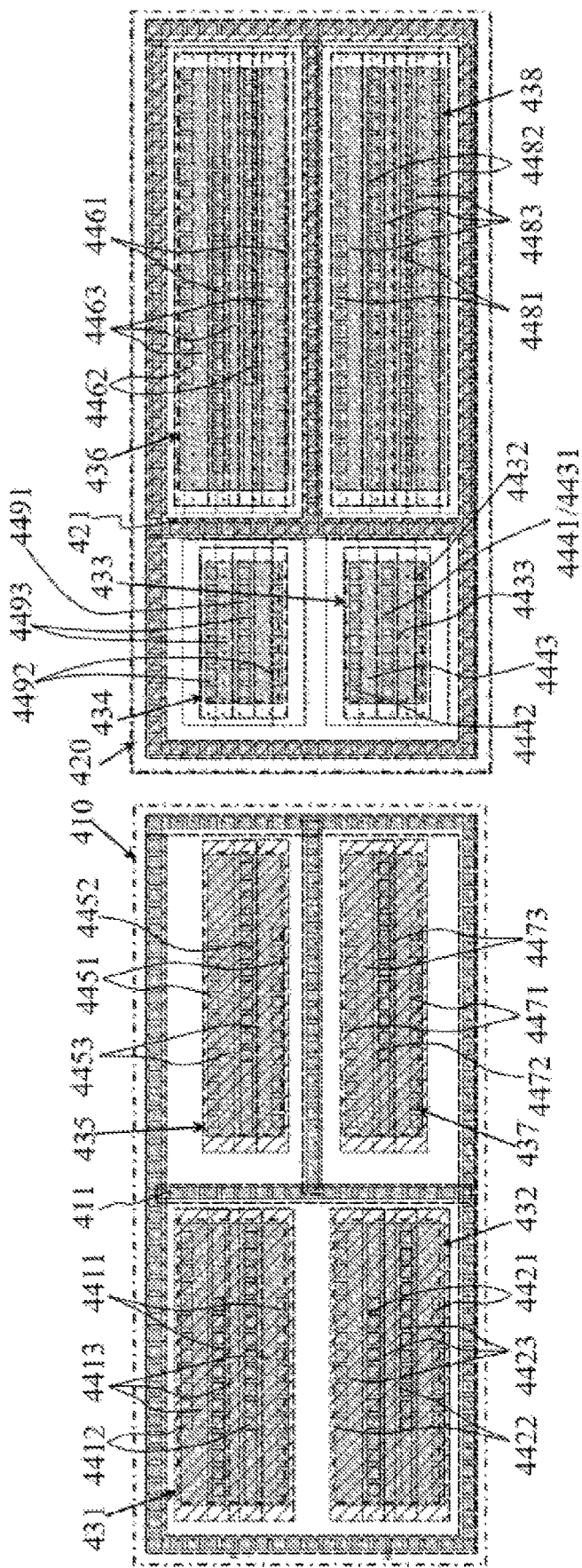
FIG. 11 is a schematic position diagram of the P-doped region on the semiconductor substrate according to an embodiment of the present disclosure.

Referring to FIGS. 10 and 11, P-type ion implantation may be performed on each active region of the N-type substrate region 420 and the P-type auxiliary doped region 411 of the P-type substrate region 410. In this way, the source and drain of each transistor located in the N-type substrate region 420 are transformed into P-type doped, and then each P-type transistor is formed in the N-type substrate region 420. When the doping concentration of the P-type auxiliary doped region 411 increases, a better anti-leakage effect is provided.

Optionally, referring to FIG. 23, the insulation dielectric layer 530 includes a first dielectric layer 531, a second dielectric layer 532 and a third dielectric layer 533 sequentially stacked on the gate layer 520. The metal wiring layer 540 includes a first metal wiring layer 541 located between the first dielectric layer 531 and the second dielectric layer 532, a second metal wiring layer 542 located between the second dielectric layer 532 and the third dielectric layer 533, and a third metal wiring layer 543 located on the surface of the third dielectric layer 533 away from the semiconductor substrate 400. The insulation dielectric layer 530 has conductive columns for electrical connection. Exemplarily, the first dielectric layer 531 is provided with a first conductive column 5311 penetrating through the first dielectric layer 531. The second dielectric layer 532 is provided with a second conductive column 5321 penetrating through the second dielectric layer 532. The third dielectric layer 533 is provided with a third conductive column 5331 penetrating through the third dielectric layer 533. The material of each conductive column may be metal or alloy material, such as metal tungsten. Optionally, when preparing any kind of conductive columns, deposition and planarization methods may be used. For example, when preparing the first conductive column 5311, a first dielectric material layer may be deposited and formed first, and then the first dielectric material layer may be patterned to form contact holes penetrating through the first dielectric material layer to obtain the first dielectric layer. Metal tungsten is then deposited, which fills the contact holes and covers the first dielectric layer. After that, planarization is performed using a CMP process, so as to obtain the first dielectric layer embedded with the first conductive column 5311 (the tungsten column in this example).

Figure 13:
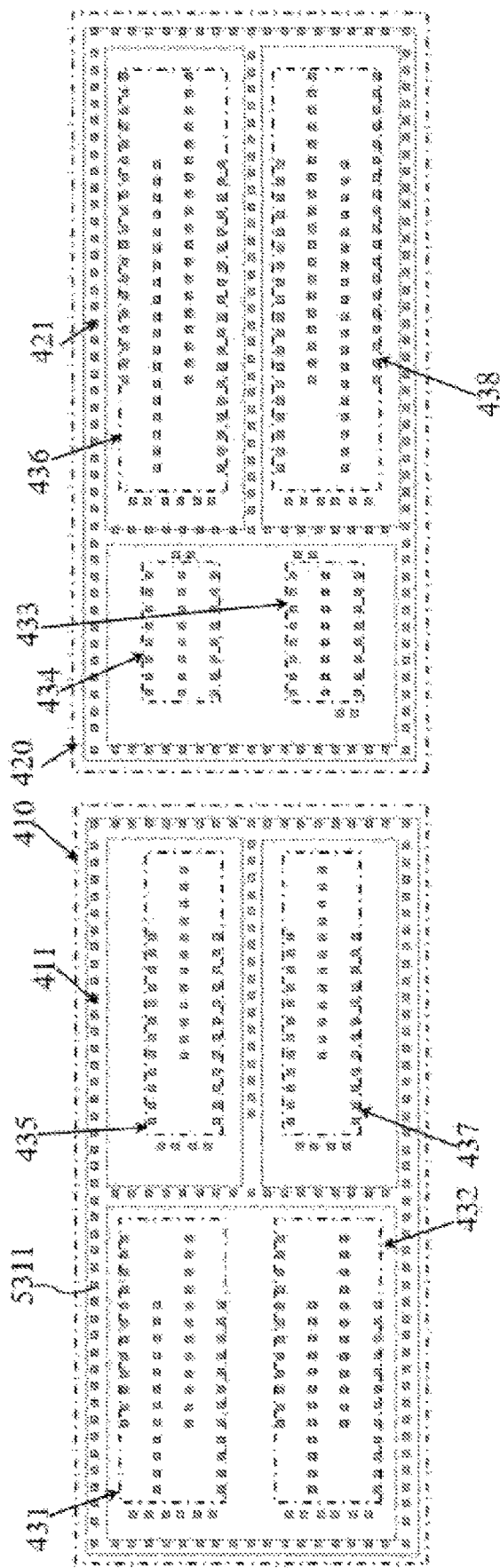
FIG. 13 is a schematic position diagram of each first conductive column according to an embodiment of the present disclosure.
Figure 14:
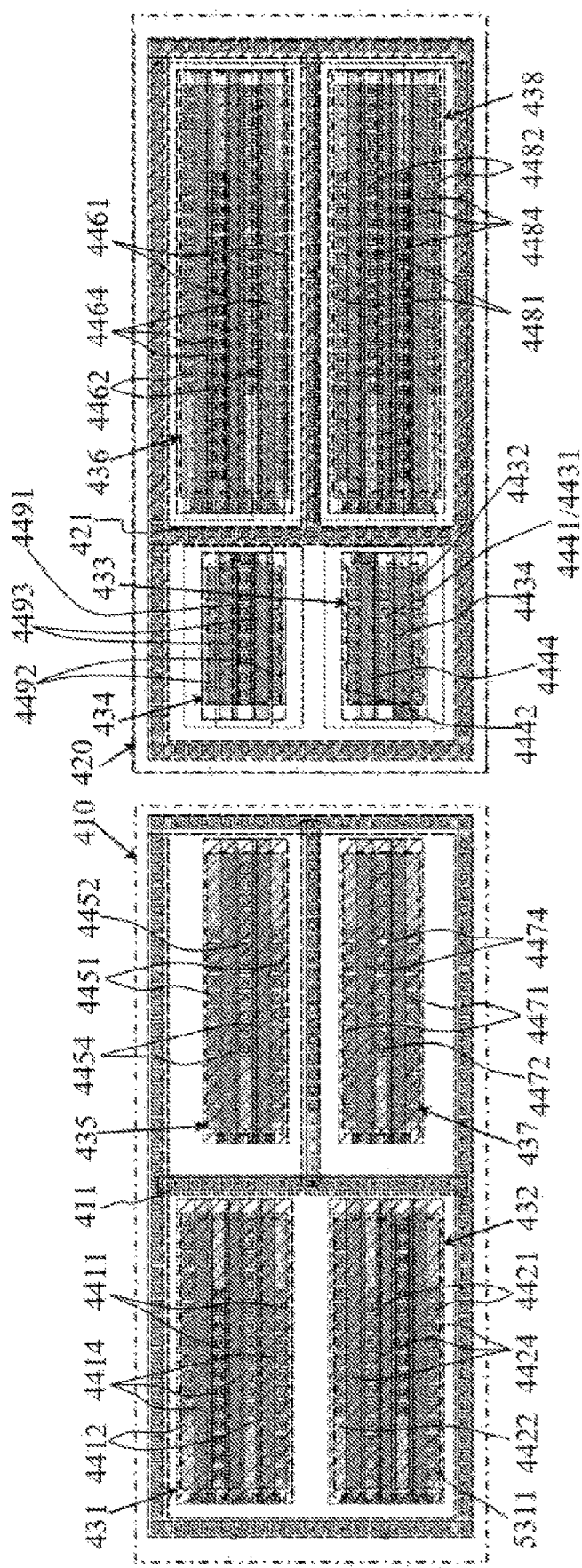
FIG. 14 is a schematic diagram of the positional relationship between each first conductive column and each transistor according to an embodiment of the present disclosure.
Figure 15:
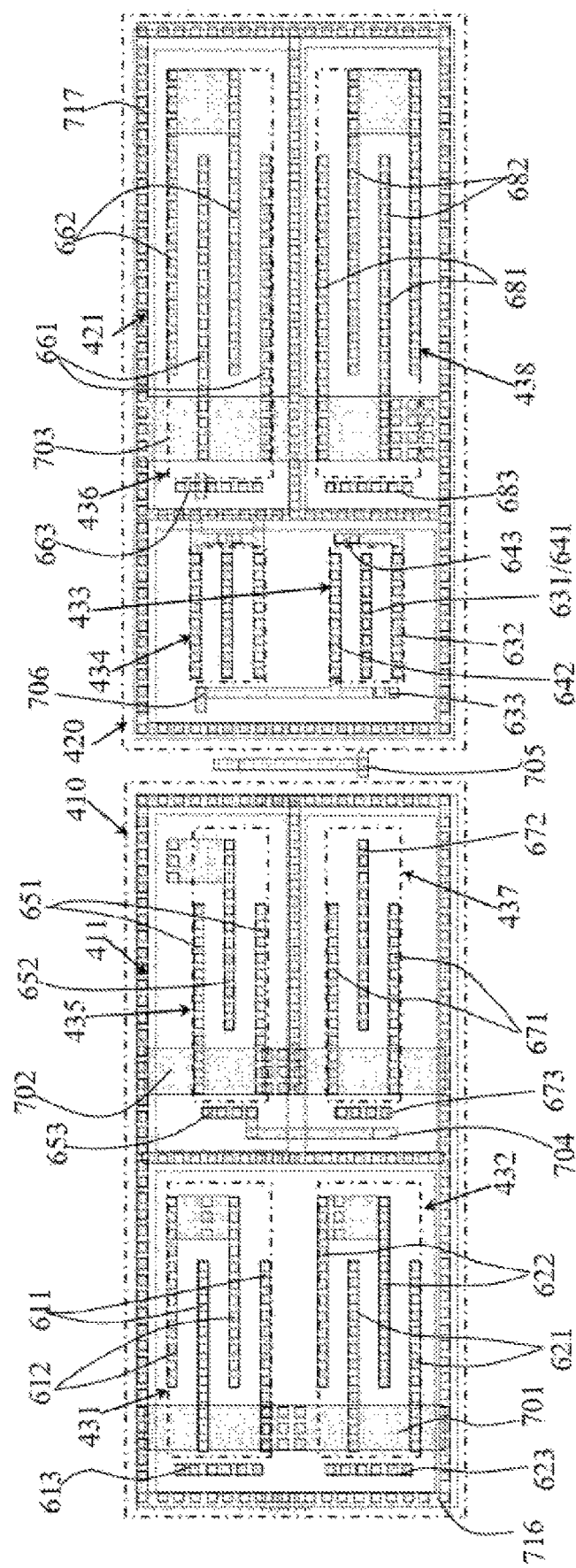
FIG. 15 is a schematic structural diagram of a first metal wiring layer according to an embodiment of the present disclosure.
Figure 16:
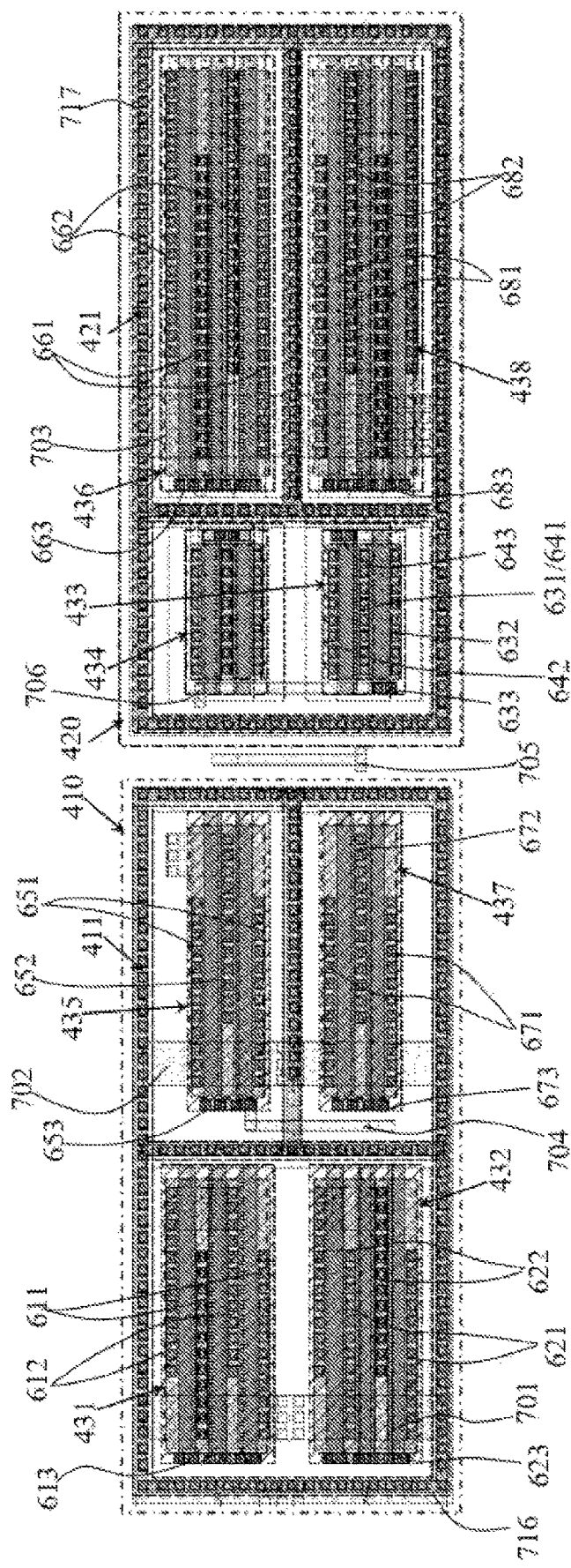
FIG. 16 is a schematic position diagram of the first metal wiring layer and each transistor according to an embodiment of the present disclosure.

With reference to FIGS. 13 and 14, the first dielectric layer 531 is provided with the first conductive column 5311, for connecting the semiconductor substrate 400 and the gate layer with the first metal wiring layer 541. Referring to FIGS. 15 and 16, the first metal wiring layer 541 includes part of the connection leads. The connection leads located on the first metal wiring layer 541 include the first connection lead 701 to the sixth connection lead 706, and further includes gate connection lines, source connection lines and drain connection lines corresponding to the first transistor M1 to the eighth transistor M8. The gate connection line corresponding to each transistor is connected with the gate of the transistor through the first conductive column 5311. For example, the gate connection line 663 corresponding to the sixth transistor M6 is connected with the gate of the sixth transistor M6 through the first conductive column 5311. The source connection line corresponding to each transistor is connected with the source of the transistor through the first conductive column 5311. The drain connection line corresponding to each transistor is connected with the drain of the transistor through the first conductive column 5311.

Referring to FIG. 15, the source connection line 611 corresponding to the first transistor M1 and the source connection line 621 corresponding to the second transistor M2 are connected with the first connection lead 701. The source connection line 651 corresponding to the fifth transistor M5 and the source connection line 671 corresponding to the seventh transistor M7 are connected with the second connection lead 702. The source connection line 661 corresponding to the sixth transistor M6 and the source connection line 681 corresponding to the eighth transistor M8 are connected with the third connection lead 703. The gate connection line 653 corresponding to the fifth transistor M5 is connected with the fourth connection lead 704. The gate connection line 633 corresponding to the third transistor M3 and the drain connection line 642 corresponding to the fourth transistor M4 are connected with the sixth connection lead 706. The drain connection line 632 corresponding to the third transistor M3 is connected with the gate connection line 643 corresponding to the fourth transistor M4.

Figure 17:
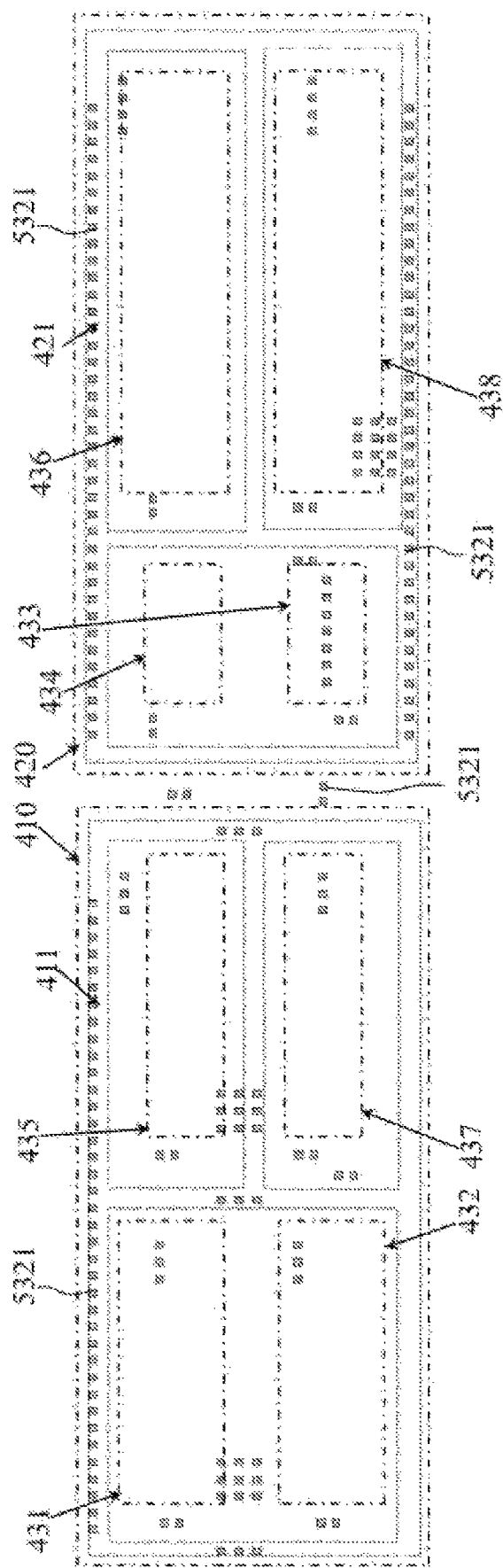
FIG. 17 is a schematic position diagram of each second conductive column according to an embodiment of the present disclosure.
Figure 18:
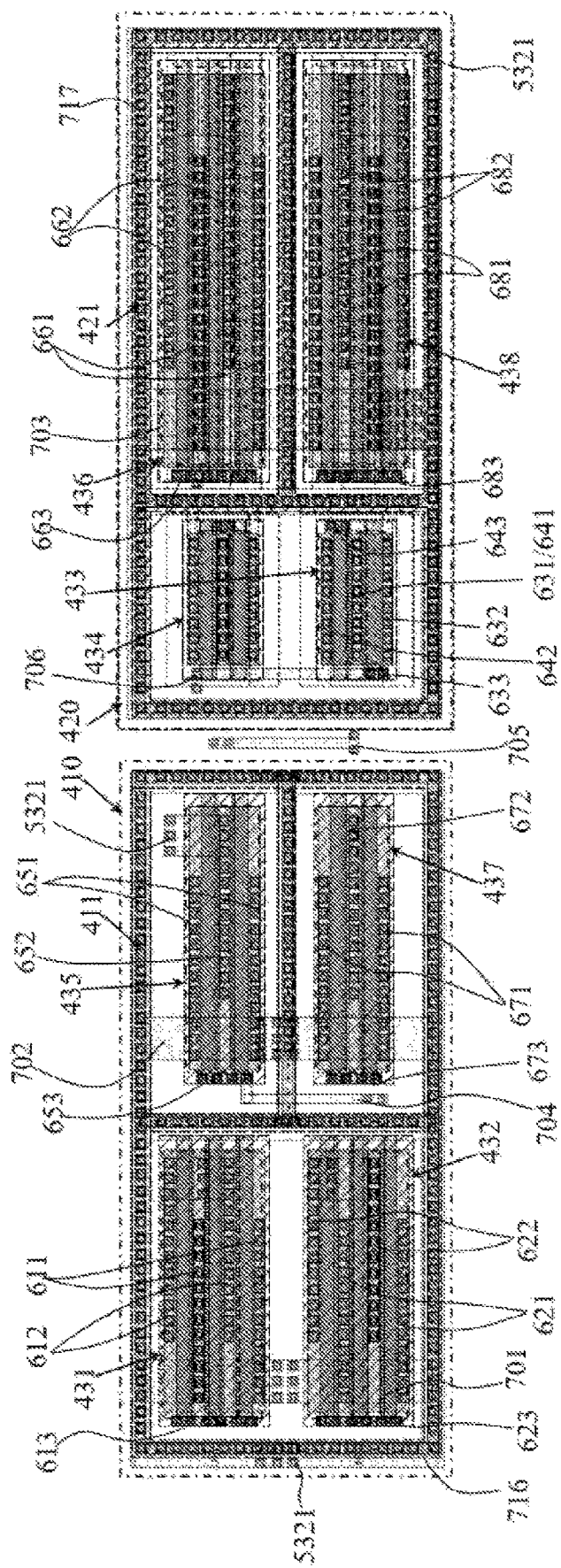
FIG. 18 is a schematic diagram of the positional relationship between each second conductive column and each transistor according to an embodiment of the present disclosure.
Figure 19:
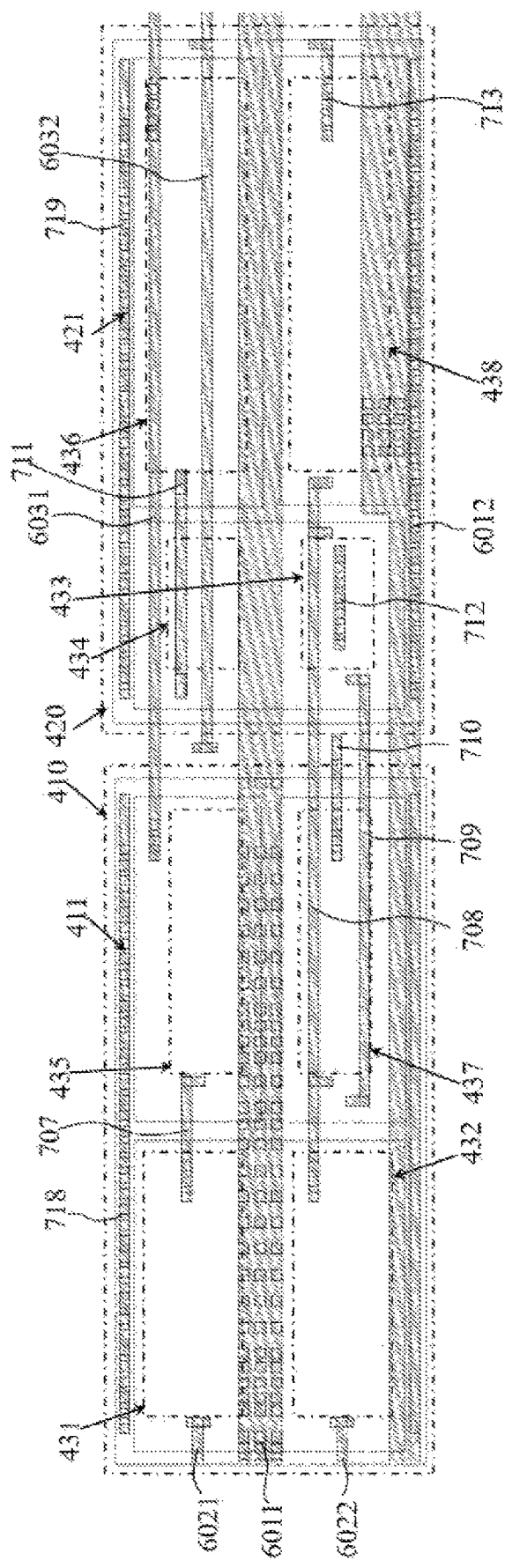
FIG. 19 is a schematic structural diagram of a second metal wiring layer according to an embodiment of the present disclosure.
Figure 20:
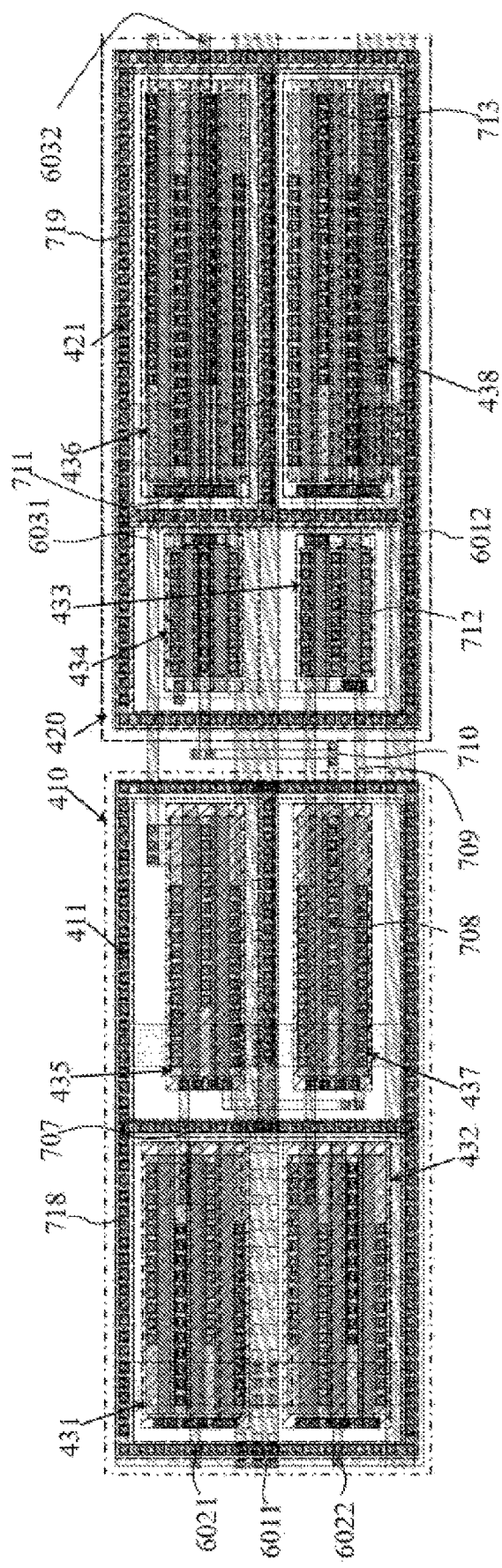
FIG. 20 is a schematic position diagram of the second metal wiring layer and each transistor according to an embodiment of the present disclosure.

Referring to FIGS. 17 and 18, the second dielectric layer 532 is provided with the second conductive column 5321, for connecting the first metal wiring layer 541 and the second metal wiring layer 542. With reference to FIGS. 19 and 20, the second metal wiring layer 542 includes a first power supply lead 6011, a second power supply lead 6012, a first control lead 6021, a second control lead 6022, a first output lead 6031, a second output lead 6032 and part of connection leads. The connection leads located on the second metal wiring layer 542 include the seventh connection lead 707 to the thirteenth connection lead 713. The first control lead 6021 is connected with the gate connection line 613 corresponding to the first transistor M1 through the second conductive column 5321. The second control lead 6022 is connected with the gate connection line 623 corresponding to the second transistor M2 through the second conductive column 5321. The first power supply lead 6011 is connected with the first connection lead 701 and the second connection lead 702 through the second conductive column 5321. The second power supply lead 6012 is connected with the third connection lead 703 through the second conductive column 5321. The seventh connection lead 707 is connected with the drain connection line 612 corresponding to the first transistor M1 and the gate connection line 653 corresponding to the fifth transistor M5 through the second conductive column 5321. The eighth connection lead 708 is connected with the drain connection line 622 corresponding to the second transistor M2, the gate connection line 643 corresponding to the fourth transistor M4, the gate connection line 673 corresponding to the seventh transistor M7, and the gate connection line 683 corresponding to the transistor M8 through the second conductive column 5321. The ninth connection lead 709 connects the fourth connection lead 704 and the gate connection line 633 corresponding to the third transistor M3 through the second conductive column 5321. The tenth connection lead 710 is connected with the drain connection line 672 corresponding to the seventh transistor M7 and the fifth connection lead 705 through the second conductive column 5321. The eleventh connection lead 711 is connected with the drain connection line 662 corresponding to the sixth transistor M6 and the sixth connection lead 706 through the second conductive column 5321. The twelfth connection lead 712 is connected with the source connection line 631 corresponding to the third transistor M3 and the source connection line 641 corresponding to the fourth transistor M4 through the second conductive column 5321. The thirteenth connection lead 713 is connected with the drain connection line 682 corresponding to the eighth transistor M8 through the second conductive column 5321. The first output lead 6031 is connected with the drain connection line 652 corresponding to the fifth transistor M5 and the drain connection line 662 corresponding to the sixth transistor M6 through the second conductive column 5321. The second output lead 6032 is connected with the sixth connection lead 706 and the thirteenth connection lead 713 through the second conductive column 5321.

Figure 21:
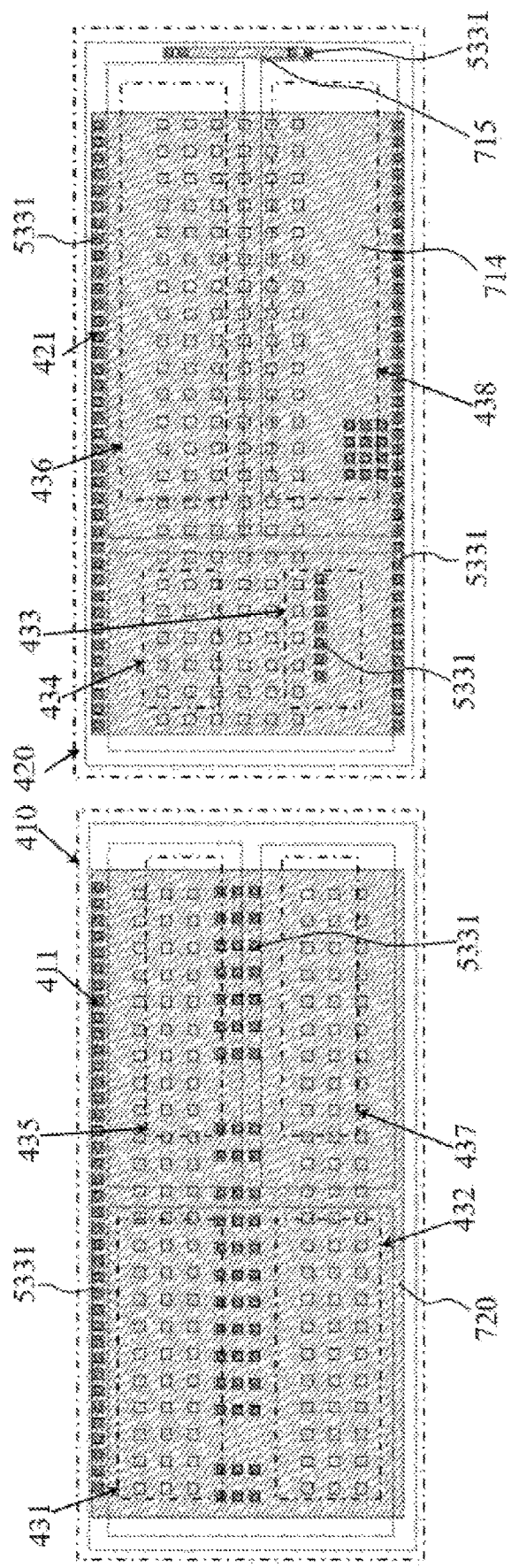
FIG. 21 is a schematic structural diagram of a third metal wiring layer according to an embodiment of the present disclosure.
Figure 22:
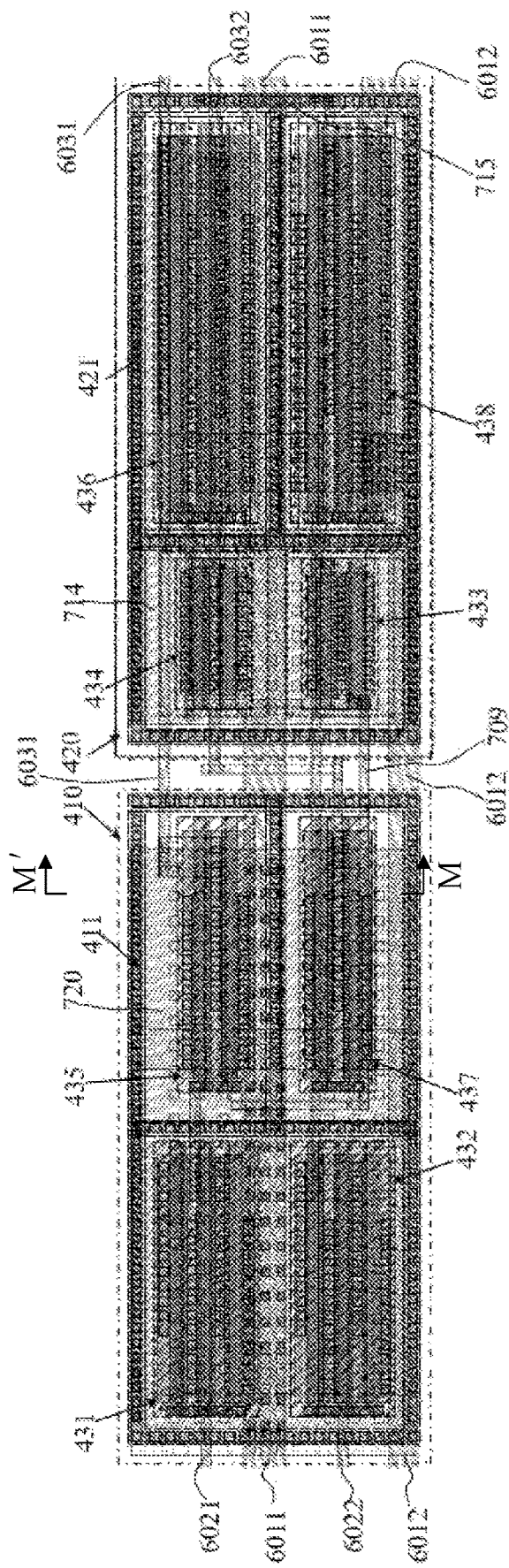
FIG. 22 is a schematic position diagram of the third metal wiring layer and each transistor according to an embodiment of the present disclosure.

The third dielectric layer 533 is provided with the third conductive column 5331, for connecting the second metal wiring layer 542 and the third metal wiring layer 543. Referring to FIGS. 21 and 22, the third metal wiring layer 543 includes part of connection leads. The connection leads located in the third metal wiring layer 543 include a fourteenth connection lead 714 and a fifteenth connection lead 715. The fourteenth connection lead 714 is connected with the twelfth connection lead 712 and the second power supply lead 6012 through the third conductive column 5331. The fifteenth connection lead 715 is connected with the twelfth connection lead 712 and the second output lead 6032 through the third conductive column 5331.

In this way, in the line drive signal enhancement region E, the metal wiring layer 540 may interconnect various transistors to form the line drive signal enhancement circuit 100.

Optionally, referring to FIG. 5, the source 4431 of the third transistor M3 and the source 4441 of the fourth transistor M4 coincide. Referring to FIG. 15, the source connection line 631 corresponding to the third transistor M3 and the source connection line 641 corresponding to the fourth transistor M4 are multiplexed into the same connection lead. In this way, the compactness of the line drive signal enhancement circuit 100 is improved and the connection leads are reduced, thereby reducing the area and power consumption of the line drive signal enhancement circuit 100.

Further, referring to FIGS. 15 and 19, the connection lead further includes a sixteenth connection lead 716 and a seventeenth connection lead 717 located on the first metal wiring layer 541. The sixteenth connection lead 716 is arranged along the wiring direction of the P-type auxiliary doped region 411, and is connected with the P-type auxiliary doped region 411 through the first conductive column 5311, and is further connected with the first power supply lead 6011 through the second conductive column 5321. The seventeenth connection lead 717 is arranged along the wiring direction of the N-type auxiliary doped region 421, and is connected with the N-type auxiliary doped region 421 through the first conductive column 5311, and is further connected with the second power supply lead 6012 through the second conductive column 5321.

In this way, the P-type auxiliary doped region 411 may be loaded with the first power supply voltage V1, which further reduces the leakage of each N-type transistor. The N-type auxiliary doped region 421 may be loaded with the second power supply voltage V2 to further reduce the leakage of each P-type transistor.

Further, referring to FIGS. 15, 19 and 21, the connection leads further include an eighteenth connection lead 718 and a nineteenth connection lead 719 located in the second metal wiring layer 542, as well as a twentieth connection lead 720 located in the third metal wiring layer 543. The eighteenth connection lead 718 is connected with the sixteenth connection lead 716 through the second conductive column 5321. The nineteenth connection lead 719 is connected with the seventeenth connection lead 717 through the second conductive column 5321, and is further connected with the fourteenth connection lead 714 through the third conductive column 5331. The twentieth connection lead 720 is connected with the eighteenth connection lead 718 and the first power supply lead 6011 through the third conductive column 5331. In this way, the impedance between the first power supply lead 6011 and the P-type auxiliary doped region 411 may be reduced, so as to ensure that the first power supply voltage V1 can be effectively and uniformly applied to the P-type auxiliary doped region 411. Moreover, the impedance between the second power supply lead 6012 and the N-type auxiliary doped region 421 may be reduced, so as to ensure that the second power supply voltage V2 can be applied to the N-type auxiliary doped region 421 effectively and uniformly as much as possible.

Preferably, referring to FIGS. 21 and 6, the twentieth connection lead 720 covers the channel region 4413 of the first transistor M1, the channel region 4423 of the second transistor M2, the channel region 4453 of the fifth transistor M5 and the channel region 4473 of the seventh transistor M7. The fourteenth connection lead 714 covers the channel region 4433 of the third transistor M3, the channel region 4443 of the fourth transistor M4, the channel region 4463 of the sixth transistor M6 and the channel region 4483 of the eighth transistor M8. In this way, the twentieth connection lead 720 helps to shield the electromagnetic interference from external signals to the first transistor M1, the second transistor M2, the fifth transistor M5 and the seventh transistor M7. The fourteenth connection lead 714 helps to shield the electromagnetic interference from external signals to the third transistor M3, the fourth transistor M4, the sixth transistor M6 and the eighth transistor M8.

In an embodiment of the present disclosure, referring to FIG. 4, the display panel is further provided with a pixel drive circuit 300 in the display area C. The pixel drive circuit 300 includes a data writing unit 310, a storage capacitor Cst and a drive transistor M03. The data writing unit 310 has a first control terminal and a second control terminal. The first control terminal of the data writing unit 310 is connected with the first output lead 6031, and the second control terminal of the data writing unit 310 is connected with the second output lead 6032. The input terminal of the data writing unit 310 is connected with the data line of the display panel, and the output terminal of the data writing unit 310 is connected with the third node F. The first electrode plate of the storage capacitor Cst is connected with the third node F, and the second electrode plate of the storage capacitor Cst is loaded with the first drive voltage. The control terminal of the drive transistor M03 is connected with the third node F, the output terminal of the drive transistor M03 is connected with the light emitting element (for example OLED) of the display panel, and the input terminal of the drive transistor M03 may be loaded with the second drive voltage.

In this way, the line drive signal enhancement circuit 100 may output the scan signal such that the data writing unit 310 is turned on or off. When the data writing unit 310 is turned on, the data voltage Vdata loaded on the input terminal of the data writing unit 310 may be loaded to the third node F.

Preferably, the data writing unit 310 may include a first switching transistor M01 and a second switching transistor M02. One of the first switching transistor M01 and the second switching transistor M02 is a P-type transistor, and the other of the first switching transistor M01 and the second switching transistor M02 is an N-type transistor. The P-type transistor may be turned on in response to the first power supply voltage V1 loaded on its control terminal. The N-type transistor may be turned on in response to the second power supply voltage V2 applied to its control terminal. In this way, the control terminal of the first switching transistor M01 may be used as the first control terminal of the data writing unit 310, and the control terminal of the second switching transistor M02 may be used as the second control terminal of the data writing unit 310. When the scan signal is applied to the first control terminal and the second control terminal of the data writing unit 310, the first switching transistor M01 and the second switching transistor M02 may be both turned on. When the non-scan signal is applied to the first control terminal and the second control terminal of the data writing unit 310, for example, when the base voltage on the first overall output terminal OUT1 and the second overall output terminal OUT2 of the line drive signal enhancement circuit 100 is applied to the first control terminal and the second control terminal of the data writing unit 310, the data writing units 310 are all turned off.

Exemplarily, if the base voltage output by the first overall output terminal OUT1 of the line drive signal enhancement circuit 100 is the first power supply voltage V1 and the voltage of the scan signal is the second power supply voltage V2, the base voltage output by the second overall output terminal OUT2 of the line drive signal enhancement circuit 100 is the second power supply voltage V2 and the voltage of the scan signal is the first power supply voltage V1. Then, the first switch transistor M01 may be an N-type transistor, and the second switch transistor M02 may be a P-type transistor.

Further, referring to FIG. 4, the display area C is provided with a first gate lead and a second gate lead. The first control terminal of the data writing unit 310 is connected with the first gate lead, and the second control terminal of the data writing unit 310 is connected with the second gate lead. The first output lead 6031 of the line drive signal enhancement circuit 100 is connected with the first gate lead, and the second output lead 6032 of the line drive signal enhancement circuit 100 is connected with the second gate lead.

Further, the first power supply lead 6011 is used for loading the first drive voltage, and the second power supply lead 6012 is used for loading the second drive voltage. In this way, in the line drive signal enhancement circuit 100 provided by an embodiment of the present disclosure, the specification of the power supply voltage serving as the scan signal is consistent with the specification of the power supply voltage of the display area C. This not only helps to simplify the power specification setting and power distribution setting of the display panel, but also significantly to improve the drive capability of the scan signal.

Optionally, referring to FIG. 4, the peripheral area D of the display panel is further provided with a plurality of shift registers 210 and a plurality of inverters 220 arranged in a one-to-one correspondence with each line drive signal enhancement circuit 100. In the line drive signal enhancement circuit 100, the shift register 210 and the inverter 220 corresponding to each other, the output terminal of the shift register 210 is connected with the input terminal of the inverter 220 and the first control lead 6021 of the line drive signal enhancement circuit 100, and the output terminal of the inverter 220 is connected with the second control lead 6022 of the line drive signal enhancement circuit 100.

In this way, the shift register 210 may output the first initial scan signal, and the first initial scan signal may be loaded into the first overall control terminal IN1 of the line drive signal enhancement circuit 100. The inverter 220 may generate an opposite second initial scan signal according to the first initial scan signal, and the second initial scan signal may be applied to the second overall control terminal IN2 of the line drive signal enhancement circuit 100. Therefore, the two control terminals of the line drive signal enhancement circuit 100 are respectively loaded with two different initial scan signals, and output the first scan signal and the second scan signal under the control of the two different initial scan signals, so as to scan the pixel drive circuit 300. In this way, the line drive signal enhancement circuit 100 may generate two opposite scan signals formed by the first power supply voltage V1 and the second power supply voltage V2 according to the first initial scan signal output by the shift register 210, thereby improving the drive capability of the scan signal.

Other embodiments of the present disclosure will readily occur to those skilled in the art upon consideration of the specification and practice of the content disclosed herein. The present application is intended to cover any variations, uses, or adaptations of the present disclosure that follow the general principle of the present disclosure and include common knowledge or techniques in the technical field not disclosed by the present disclosure. The specification and examples are to be regarded as exemplary only, with the true scope and spirit of the present disclosure being indicated by the appended claims.

The invention claimed is:

1. A line drive signal enhancement circuit, comprising: a control unit, an inverter unit, a first output unit and a second output unit, wherein
   the control unit has a first peripheral control terminal, a second peripheral control terminal, an input terminal and an output terminal, wherein the input terminal of the control unit is electrically connected with a first power supply lead, and the first peripheral control terminal and the second peripheral control terminal are configured to load two inverted signals respectively;
   the first output unit has a control terminal, a first overall output terminal and two input terminals, wherein the two input terminals are respectively electrically connected with the first power supply lead and a second power supply lead; and
   the second output unit has a control terminal, a second overall output terminal and two input terminals, wherein the two input terminals are respectively electrically connected with the first power supply lead and the second power supply lead, wherein
   the output terminal of the control unit is electrically connected with the control terminal of the first output unit, and/or the output terminal of the control unit is electrically connected with the control terminal of the second output unit;
   one of the control terminal of the first output unit and the control terminal of the second output unit is electrically connected with the output terminal of the control unit through the inverter unit; and
   the input terminal of the control unit and the first power supply lead are electrically connected through at least two conductive materials.

2. The line drive signal enhancement circuit according to claim 1, wherein
   the first power supply lead is configured to load a first power supply voltage, and the second power supply lead is configured to load a second power supply voltage;
   the control unit is configured to output the first power supply voltage to a first node or a second node under control of the first peripheral control terminal and the second peripheral control terminal;
   the inverter unit is connected with the first node and the second node, for outputting the second power supply voltage to the second node in response to the first power supply voltage loaded on the first node, and outputting the second power supply voltage to the first node in response to the first power supply voltage loaded on the second node;
   the first output unit is connected with the first node, for outputting one of the first power supply voltage and the second power supply voltage to the first overall output terminal under control of the first node; and
   the second output unit is connected with the second node, for outputting the other of the first power supply voltage and the second power supply voltage to the second overall output terminal under control of the second node.

3. The line drive signal enhancement circuit according to claim 2, wherein the control unit comprises:
   a first transistor, having an input terminal loaded with the first power supply voltage, an output terminal connected with the first node, and a control terminal serving as the first peripheral control terminal, wherein the first transistor is configured to output the first power supply voltage to the first node under control of the control terminal of the first transistor;

a second transistor, having an input terminal loaded with the first power supply voltage, an output terminal connected with the second node, and a control terminal serving as the second peripheral control terminal, wherein the second transistor is configured to output the first power supply voltage to the second node under control of the control terminal of the second transistor; and the first transistor and the second transistor are both N-type transistors or both P-type transistors.

4. The line drive signal enhancement circuit according to claim 2, wherein the inverter unit comprises:

a third transistor, having a control terminal connected with the first node, an input terminal loaded with the second power supply voltage, and an output terminal connected with the second node, wherein the third transistor is configured to output the second power supply voltage to the second node under control of the first power supply voltage loaded on the first node; and a fourth transistor, having a control terminal connected with the second node, an input terminal loaded with the second power supply voltage, and an output terminal connected with the first node, wherein the fourth transistor is configured to output the second power supply voltage to the first node under control of the first power supply voltage loaded on the second node.

5. The line drive signal enhancement circuit according to claim 2, wherein the first output unit comprises:

a fifth transistor, having a control terminal connected with the first node, an input terminal loaded with the first power supply voltage, and an output terminal connected with the first overall output terminal;

a sixth transistor, having a control terminal connected with the first node, an input terminal loaded with the second power supply voltage, and an output terminal connected with the first overall output terminal, and the second output unit comprises:

a seventh transistor, having a control terminal connected with the second node, an input terminal loaded with the first power supply voltage, and an output terminal connected with the second overall output terminal;

an eighth transistor, having a control terminal connected with the second node, an input terminal loaded with the second power supply voltage, and an output terminal connected with the second overall output terminal, wherein a first terminal of the fifth transistor and a first terminal of the seventh transistor are configured to load the first power supply voltage, and a first terminal of the sixth transistor and a first terminal of the eighth transistor are configured to load the second power supply voltage; and wherein transistor types of the fifth transistor and the seventh transistor are the same, transistor types of the sixth transistor and the eighth transistor are the same, and transistor types of the fifth transistor and the sixth transistor are different.

6. A shift register unit, comprising:

a shift register;

an inverter; and a line drive signal enhancement circuit, wherein the shift register is configured to output an initial scan signal to an input terminal of the inverter and a first overall control terminal of the line drive signal enhancement circuit; and an output terminal of the inverter is connected with a second overall control terminal of the line drive signal enhancement circuit, wherein the line drive signal enhancement circuit, comprising: a control unit, an inverter unit, a first output unit and a second output unit, wherein the control unit has a first peripheral control terminal, a second peripheral control terminal, an input terminal and an output terminal, wherein the input terminal of the control unit is electrically connected with a first power supply lead, and the first peripheral control terminal and the second peripheral control terminal are configured to load two inverted signals respectively;

the first output unit has a control terminal, the first overall output terminal and two input terminals, wherein the two input terminals are respectively electrically connected with the first power supply lead and a second power supply lead; and the second output unit has a control terminal, the second overall output terminal and two input terminals, wherein the two input terminals are respectively electrically connected with the first power supply lead and the second power supply lead, wherein the output terminal of the control unit is electrically connected with the control terminal of the first output unit, and/or the output terminal of the control unit is electrically connected with the control terminal of the second output unit;

one of the control terminal of the first output unit and the control terminal of the second output unit is electrically connected with the output terminal of the control unit through the inverter unit; and the input terminal of the control unit and the first power supply lead are electrically connected through at least two conductive materials.

7. A display panel, comprising the shift register unit according to claim 6, wherein the display panel comprises a display area and a peripheral area surrounding the display area, wherein the shift register unit is located in the peripheral area, and the line drive signal enhancement circuit is located between the shift register and the display area.

8. The display panel according to claim 7, wherein the line drive signal enhancement circuit comprises first to eighth transistors, wherein the first transistor, the second transistor, the fifth transistor and the seventh transistor are N-type transistors, and the third transistor, the fourth transistor, the sixth transistor and the eighth transistor are P-type transistors.

9. The display panel according to claim 8, wherein the peripheral area comprises at least one line drive signal enhancement region provided with the first to eighth transistors; and the line drive signal enhancement region comprises a P-type substrate region and an N-type substrate region, wherein the P-type substrate region is located at a side of the N-type substrate region away from the display area, the N-type transistors are provided in the P-type substrate region, and the P-type transistors are provided in the N-type substrate region.

10. The display panel according to claim 9, wherein the P-type substrate region comprises a first active region, a second active region, a fifth active region and a seventh active region isolated from each other, and further comprises a P-type auxiliary doped region;

the first active region and the fifth active region are arranged along a first direction, the second active region and the seventh active region are arranged along the first direction, and the first direction is parallel to a plane where a semiconductor substrate is located and is further perpendicular to an edge of the display area close to the shift register unit;

the fifth active region and the seventh active region are arranged along a second direction, the first active region and the second active region are arranged along the second direction, and the second direction is parallel to the plane where the semiconductor substrate is located and is further perpendicular to the first direction;

the fifth active region and the seventh active region are respectively surrounded by the P-type auxiliary doped region, the first active region and the second active region are located at a side of the fifth active region and the seventh active region away from the display area, and the first active region and the second active region are surrounded by the P-type auxiliary doped region together; and the first transistor is located in the first active region, the second transistor is located in the second active region, the fifth transistor is located in the fifth active region, and the seventh transistor is located in the seventh active region.

11. The display panel according to claim 10, wherein
the N-type substrate region comprises a third active region, a sixth active region, and an eighth active region isolated from each other, and further comprises an N-type auxiliary doped region;

the sixth active region and the eighth active region are arranged along the second direction, the sixth active region and the eighth active region are respectively surrounded by the N-type auxiliary doped region, the third active region is located at a side of the sixth active region and the eighth active region away from the display area, and the third active region is surrounded by the N type auxiliary doped region; and the third transistor and the fourth transistor are located in the third active region, the sixth transistor is located in the sixth active region, and the eighth transistor is located in the eighth active region.

12. The display panel according to claim 11, wherein
the display panel comprises a semiconductor substrate, wherein the semiconductor substrate is provided with active regions of the first to eighth transistors, and the active region of each transistor comprises a channel region, and a source and a drain located at both sides of the channel region; and in the line drive signal enhancement region, the channel region of the transistor, the source of the transistor and the drain of the transistor all extend along a direction toward the display area.

13. The display panel according to claim 12, wherein
the display panel further comprises a gate insulation layer and a gate layer sequentially stacked on the semiconductor substrate;

in the line drive signal enhancement region, the gate layer comprises a gate of each transistor, and the gate of each transistor comprises a gate region and a lead region connected with each other; and an orthographic projection of the gate region of the gate of each transistor on the base substrate overlaps with the channel region of the transistor.

14. The display panel according to claim 13, wherein
the display panel further comprises a first dielectric layer and a first metal wiring layer sequentially stacked on a side of the gate layer away from the semiconductor substrate;

in the line drive signal enhancement region, the first dielectric layer is provided with a first conductive column penetrating through the first dielectric layer and connected with the lead region of the gate of each transistor, and further provided with a second conductive column penetrating through the first dielectric layer and the gate insulation layer and connected with the semiconductor substrate;

in the line drive signal enhancement region, the first metal wiring layer comprises first to third connection leads, and further comprises gate connection lines, source connection lines and drain connection lines corresponding to the first to eighth transistors, and each of the drain connection lines comprises a drain region and a connection region connected with each other;

in the line drive signal enhancement region, the gate connection line corresponding to each transistor is electrically connected with the lead region of the gate of the transistor through the first conductive column, the source connection line corresponding to each transistor is connected with the source of the transistor through the second conductive column, and the drain region of the drain connection line corresponding to each transistor is connected with the drain of the transistor through the second conductive column; and the source connection lines corresponding to the first transistor and the second transistor are connected with the first connection lead, the source connection lines corresponding to the fifth transistor and the seventh transistor are connected with the second connection lead, the source connection lines corresponding to the sixth transistor and the eighth transistor are connected with the third connection lead, the connection region of the drain connection line corresponding to the third transistor is connected with the gate connection line corresponding to the fourth transistor, and the connection region of the drain connection line corresponding to the fourth transistor is connected with the gate connection line corresponding to the third transistor.

15. The display panel according to claim 14, wherein
in the line drive signal enhancement region, the first metal wiring layer further comprises fourth to sixth connection leads, a sixteenth connection lead and a seventeenth connection lead;

the sixteenth connection lead is arranged along a wiring direction of the P-type auxiliary doped region, and is connected with the P-type auxiliary doped region through the second conductive column;

the seventeenth connection lead is arranged along a wiring direction of the N-type auxiliary doped region, and is connected with the N-type auxiliary doped region through the second conductive column;

the first connection lead extends along the second direction and has both ends connected with the sixteenth connection lead, the second connection lead extends along the second direction and has both ends connected with the sixteenth connection lead, and the third connection lead extends along the second direction and has both ends connected with the seventeenth connection lead;

the fourth connection lead is connected with the gate connection line corresponding to the fifth transistor, and extends along the second direction;

the fifth connection lead is located between the P-type substrate region and the N-type substrate region, and extends along the second direction; and the sixth connection lead is connected with the connection region of the drain connection line corresponding to the fourth transistor, and extends along the second direction.

16. The display panel according to claim 15, wherein the display panel further comprises a second dielectric layer and a second metal wiring layer sequentially stacked on a side of the first metal wiring layer away from the semiconductor substrate;

the second dielectric layer is provided with a third conductive column penetrating through the second dielectric layer and connected with the first metal wiring layer, wherein the second metal wiring layer is connected with the first metal wiring layer through the third conductive column; and in the line drive signal enhancement region, the second metal wiring layer comprises seventh to thirteenth connection leads, a first power supply lead, a second power supply lead, a first control lead, a second control lead, a first output lead and a second output lead, and each lead extends along the first direction; wherein the first control lead is connected with the gate connection line corresponding to the first transistor;

the second control lead is connected with the gate connection line corresponding to the second transistor;

the first power supply lead is connected with the first connection lead and the second connection lead;

the second power supply lead is connected with the third connection lead;

the seventh connection lead is connected with the connection region of the drain connection line corresponding to the first transistor and the gate connection line corresponding to the fifth transistor;

the eighth connection lead is connected with the connection region of the drain connection line corresponding to the second transistor, the gate connection line corresponding to the fourth transistor, the gate connection line corresponding to the seventh transistor, and the gate connection line corresponding to the eighth transistor;

the ninth connection lead is connected with an end of the fourth connection lead away from the gate connection line corresponding to the fifth transistor, and is further connected with the gate connection line corresponding to the third transistor;

the tenth connection lead is connected with the connection region of the drain connection line corresponding to the seventh transistor, and is further connected with the fifth connection lead;

the eleventh connection lead is connected with the gate connection line corresponding to the sixth transistor, and is further connected with an end of the sixth connection lead away from the gate connection line corresponding to the third transistor;

the twelfth connection lead is connected with the source connection line corresponding to the third transistor and the source connection line corresponding to the fourth transistor;

the thirteenth connection lead is connected with the connection region of the drain connection line corresponding to the eighth transistor;

the first output lead is connected with the connection region of the drain connection line corresponding to the fifth transistor and the connection region of the drain connection line corresponding to the sixth transistor; and the second output lead is connected with the sixth connection lead.

17. The display panel according to claim 16, wherein the display panel further comprises a third dielectric layer and a third metal wiring layer sequentially stacked on a side of the second metal wiring layer away from the semi conductor substrate;

in the line drive signal enhancement region, the third dielectric layer is provided with a fourth conductive column penetrating through the third dielectric layer and connected with the second metal wiring layer;

the third metal wiring layer is connected with the second metal wiring layer through the fourth conductive column;

the third metal wiring layer comprises a fourteenth connection lead and a fifteenth connection lead, wherein the fourteenth connection lead is connected with the second power supply lead and the twelfth connection lead, and the fifteenth connection lead is connected with the thirteenth connection lead and the second output lead.

18. The display panel according to claim 17, wherein in the line drive signal enhancement region, the second metal wiring layer further comprises an eighteenth connection lead extending along the first direction and a nineteenth connection lead extending along the first direction;

the third metal wiring layer further comprises a twentieth connection lead;

the eighteenth connection lead is connected with the sixteenth connection lead and the twentieth connection lead;

the nineteenth connection lead is connected with the seventeenth connection lead and the fourteenth connection lead;

an orthographic projection of the twentieth connection lead on the base substrate covers the channel regions of the first transistor, the second transistor, the fifth transistor and the seventh transistor;

an orthographic projection of the fourteenth connection lead on the base substrate covers the channel regions of the third transistor, the fourth transistor, the sixth transistor transistor and the eighth transistor.

19. The display panel according to claim 15, wherein the source corresponding to the third transistor and the source corresponding to the fourth transistor coincide with each other; and the source connection line corresponding to the third transistor and the source connection line corresponding to the fourth transistor are multiplexed into a same lead.

20. The display panel according to claim 14, wherein in the line drive signal enhancement region, the N-type substrate region further comprises a fourth active region, wherein the fourth active region and the third active region are arranged along the second direction, the third active region and the eighth active region are arranged along the first direction, the fourth active region and the sixth active region are arranged along the first direction, and the display panel is provided with an auxiliary transistor in the fourth active region; and an active region of the auxiliary transistor is located in the fourth active region, a gate of the auxiliary transistor is located in the gate layer, a source connection line corresponding to the auxiliary transistor is located in the first metal wiring layer and connected with the source of the auxiliary transistor, a drain connection line corresponding to the auxiliary transistor is located in the first metal wiring layer and connected with the drain of the auxiliary transistor, a gate connection line corresponding to the auxiliary transistor is located in the first metal wiring layer and connected with the gate of the auxiliary transistor, and the source connection line, the drain connection line and the gate connection line corresponding to the auxiliary transistor are connected with the seventeenth connection lead.

* * * * *